United States Patent [19]
Hagen et al.

[11] Patent Number: 6,104,967
[45] Date of Patent: Aug. 15, 2000

[54] FAULT-TOLERANT BATTERY SYSTEM EMPLOYING INTRA-BATTERY NETWORK ARCHITECTURE

[75] Inventors: Ronald A. Hagen, Stillwater, Minn.; Kenneth W. Chen, Fair Oaks, Calif.; Christophe Comte, Montreal, Canada; Orlin B. Knudson, Vadnais Heights, Minn.; Jean Rouillard, Saint-Luc, Canada

[73] Assignee: 3M Innovative Properties Company, St. Paul, Minn.

[21] Appl. No.: 08/900,928

[22] Filed: Jul. 25, 1997

[51] Int. Cl.⁷ .................. H02J 1/14; H02J 3/02; H02J 3/12; H02H 7/00; H02H 9/00
[52] U.S. Cl. .................. 700/293; 700/292; 700/294; 700/295; 429/50; 429/61; 429/62
[58] Field of Search ............... 364/520, 528.27, 364/528.28, 528.29, 528.3, 453; 320/5, 6, 7, 18, 21; 427/6, 7, 62, 152, 159, 162; 700/292, 293, 294, 295; 429/50, 61, 62

[56] References Cited

U.S. PATENT DOCUMENTS

| | | | |
|---|---|---|---|
| 2,812,376 | 11/1957 | Yardney | 136/6 |
| 3,193,412 | 7/1965 | Salkind et al. | 136/6 |
| 3,275,770 | 9/1966 | Kilmer et al. | 240/82 |
| 3,390,014 | 6/1968 | Eisler | 136/6 |

(List continued on next page.)

FOREIGN PATENT DOCUMENTS

| | | |
|---|---|---|
| 044 753 A1 | 1/1982 | European Pat. Off. . |
| 145 498 A2 | 6/1985 | European Pat. Off. . |
| 177 225 A1 | 4/1986 | European Pat. Off. . |
| 244 683 A1 | 11/1987 | European Pat. Off. . |
| 310 075 A2 | 4/1989 | European Pat. Off. . |
| 336 102 A2 | 10/1989 | European Pat. Off. . |
| 569 035 A1 | 11/1993 | European Pat. Off. . |
| 570 590 A1 | 11/1993 | European Pat. Off. . |
| 584 639 A1 | 3/1994 | European Pat. Off. . |
| 643 429 A2 | 3/1995 | European Pat. Off. . |
| 652 620 A1 | 5/1995 | European Pat. Off. . |
| 700 109 A1 | 3/1996 | European Pat. Off. . |
| 0 721 247 A2 | 7/1996 | European Pat. Off. . |
| 774 795 A2 | 5/1997 | European Pat. Off. . |
| 780 920 A1 | 6/1997 | European Pat. Off. . |

(List continued on next page.)

*Primary Examiner*—Paul P. Gordon
*Assistant Examiner*—Ramesh Patel
*Attorney, Agent, or Firm*—Mueting, Raasch & Gebhardt, P.A.

[57] ABSTRACT

A distributed energy storing system employing a communications network is disclosed. A distributed battery system includes a number of energy storing modules, each of which includes a processor and communications interface. In a network mode of operation, a battery computer communicates with each of the module processors over an intra-battery network and cooperates with individual module processors to coordinate module monitoring and control operations. The battery computer monitors a number of battery and module conditions, including the potential and current state of the battery and individual modules, and the conditions of the battery's thermal management system. An over-discharge protection system, equalization adjustment system, and communications system are also controlled by the battery computer. The battery computer logs and reports various status data on battery level conditions which may be reported to a separate system platform computer. A module transitions to a stand-alone mode of operation if the module detects an absence of communication connectivity with the battery computer. A module which operates in a stand-alone mode performs various monitoring and control functions locally within the module to ensure safe and continued operation.

27 Claims, 31 Drawing Sheets

U.S. PATENT DOCUMENTS

| | | | |
|---|---|---|---|
| 3,578,506 | 5/1971 | Chassoux | 136/168 |
| 3,630,783 | 12/1971 | Przybyla | 136/107 |
| 3,786,466 | 1/1974 | Naito et al. | 340/255 |
| 3,899,355 | 8/1975 | Chiklis | 429/157 |
| 3,937,635 | 2/1976 | Mead et al. | 136/83 R |
| 4,028,479 | 6/1977 | Fanciullo et al. | 429/152 |
| 4,060,669 | 11/1977 | Fanciullo | 429/152 |
| 4,060,670 | 11/1977 | Tamminen | 429/154 |
| 4,061,955 | 12/1977 | Thomas et al. | 320/6 |
| 4,080,728 | 3/1978 | Buckler | 29/623.4 |
| 4,091,186 | 5/1978 | Ott et al. | 429/94 |
| 4,098,965 | 7/1978 | Kinsman | 429/153 |
| 4,105,807 | 8/1978 | Arora | 427/126 |
| 4,137,627 | 2/1979 | Kinsman | 29/623.4 |
| 4,152,825 | 5/1979 | Bruneau | 29/623.2 |
| 4,207,389 | 6/1980 | Gunther et al. | 429/164 |
| 4,209,479 | 6/1980 | Gunther et al. | 264/104 |
| 4,233,371 | 11/1980 | Dorrestijn | 429/152 |
| 4,238,721 | 12/1980 | DeLuca et al. . | |
| 4,241,152 | 12/1980 | Klink | 429/181 |
| 4,322,484 | 3/1982 | Sugalski | 429/1 |
| 4,339,638 | 7/1982 | Lascelles et al. | 200/52 R |
| 4,342,978 | 8/1982 | Meister . | |
| 4,370,531 | 1/1983 | Tobin . | |
| 4,383,013 | 5/1983 | Bindin et al. | 429/112 |
| 4,409,538 | 10/1983 | Tabata . | |
| 4,429,026 | 1/1984 | Bruder | 429/152 |
| 4,477,545 | 10/1984 | Akridge et al. | 429/191 |
| 4,479,083 | 10/1984 | Sullivan . | |
| 4,490,707 | 12/1984 | O'Leary . | |
| 4,495,259 | 1/1985 | Uba | 429/161 |
| 4,507,857 | 4/1985 | Epstein et al. | 29/623.2 |
| 4,517,265 | 5/1985 | Belanger et al. . | |
| 4,518,665 | 5/1985 | Fujita et al. . | |
| 4,525,439 | 6/1985 | Simonton | 429/162 |
| 4,547,438 | 10/1985 | McArthur et al. | 429/82 |
| 4,571,468 | 2/1986 | Weldon . | |
| 4,664,993 | 5/1987 | Sturgis et al. | 429/178 |
| 4,670,703 | 6/1987 | Williams | 320/22 |
| 4,691,085 | 9/1987 | Swanson . | |
| 4,692,577 | 9/1987 | Swanson . | |
| 4,707,795 | 11/1987 | Alber et al. | 364/550 |
| 4,752,540 | 6/1988 | Chua et al. | 429/56 |
| 4,758,483 | 7/1988 | Armand et al. . | |
| 4,816,354 | 3/1989 | Tamminen | 429/162 |
| 4,824,746 | 4/1989 | Belanger et al. . | |
| 4,828,939 | 5/1989 | Turley et al. . | |
| 4,851,307 | 7/1989 | Armand et al. . | |
| 4,852,684 | 8/1989 | Packard . | |
| 4,883,726 | 11/1989 | Peled et al. | 424/120 |
| 4,887,348 | 12/1989 | Amminen | 29/623.2 |
| 4,897,917 | 2/1990 | Gauthier et al. . | |
| 4,911,993 | 3/1990 | Turley et al. | 429/27 |
| 4,913,259 | 4/1990 | Packard . | |
| 4,927,717 | 5/1990 | Turley et al. | 429/27 |
| 4,961,043 | 10/1990 | Koenck | 320/21 |
| 4,967,136 | 10/1990 | Nofzinger . | |
| 4,973,936 | 11/1990 | Dimpault-Darcy et al. | 338/32 R |
| 4,997,732 | 3/1991 | Austin et al. | 429/153 |
| 5,008,161 | 4/1991 | Johnston | 429/7 |
| 5,057,385 | 10/1991 | Hope et al. . | |
| 5,066,555 | 11/1991 | Tamminen | 429/121 |
| 5,070,787 | 12/1991 | Weldon et al. . | |
| 5,071,652 | 12/1991 | Jones et al. . | |
| 5,089,027 | 2/1992 | Rossoll et al. | 29/623.2 |
| 5,162,171 | 11/1992 | Jones . | |
| 5,180,641 | 1/1993 | Burns et al. | 429/59 |
| 5,197,889 | 3/1993 | Rizzo et al. | 439/76 |
| 5,199,239 | 4/1993 | Younger | 52/595 |
| 5,204,194 | 4/1993 | Miller et al. | 429/7 |
| 5,227,259 | 7/1993 | Weaver et al. . | |
| 5,227,264 | 7/1993 | Duval et al. . | |
| 5,300,373 | 4/1994 | Shackle | 429/152 |
| 5,313,152 | 5/1994 | Wozniak et al. . | |
| 5,324,597 | 6/1994 | Leadbetter et al. | 429/62 |
| 5,337,042 | 8/1994 | Hormel et al. . | |
| 5,346,786 | 9/1994 | Hodgetts | 429/159 |
| 5,354,630 | 10/1994 | Earl . | |
| 5,363,405 | 11/1994 | Hormel . | |
| 5,382,480 | 1/1995 | Molyneux | 429/120 |
| 5,384,212 | 1/1995 | Heiman et al. . | |
| 5,385,793 | 1/1995 | Tiedemann et al. | 429/62 |
| 5,393,617 | 2/1995 | Klein | 320/15 |
| 5,401,595 | 3/1995 | Kagawa et al. | 429/152 |
| 5,409,787 | 4/1995 | Blanyer et al. . | |
| 5,415,954 | 5/1995 | Gauthier et al. . | |
| 5,422,200 | 6/1995 | Hope et al. . | |
| 5,423,110 | 6/1995 | Gauthier et al. . | |
| 5,438,249 | 8/1995 | Chang et al. | 429/120 |
| 5,478,667 | 12/1995 | Shackle et al. | 324/509 |
| 5,478,668 | 12/1995 | Gozdz et al. | 429/127 |
| 5,479,083 | 12/1995 | Brainard . | |
| 5,487,958 | 1/1996 | Tura et al. . | |
| 5,503,947 | 4/1996 | Kelly et al. . | |
| 5,503,948 | 4/1996 | MacKay et al. . | |
| 5,504,415 | 4/1996 | Podrazhansky et al. | 320/18 |
| 5,519,563 | 5/1996 | Higashijimaa et al. . | |
| 5,521,024 | 5/1996 | Sasaki et al. | 429/162 |
| 5,528,122 | 6/1996 | Sullivan et al. . | |
| 5,530,336 | 6/1996 | Eguchi et al. . | |
| 5,532,087 | 7/1996 | Nerz et al. . | |
| 5,547,775 | 8/1996 | Eguchi et al. . | |
| 5,547,780 | 8/1996 | Kagawa et al. . | |
| 5,548,200 | 8/1996 | Nor et al. . | |
| 5,556,576 | 9/1996 | Kim . | |
| 5,561,380 | 10/1996 | Sway-Tin et al. | 451/296 |
| 5,563,002 | 10/1996 | Harshe | 429/7 |
| 5,567,539 | 10/1996 | Takahashi et al. . | |
| 5,568,039 | 10/1996 | Fernandez . | |
| 5,569,063 | 10/1996 | Morioka et al. | 429/247 |
| 5,569,550 | 10/1996 | Garrett et al. . | |
| 5,573,869 | 11/1996 | Hwang et al. . | |
| 5,582,931 | 12/1996 | Soichiro . | |
| 5,585,207 | 12/1996 | Wakabe et al. . | |
| 5,589,290 | 12/1996 | Klink et al. . | |
| 5,593,604 | 1/1997 | Beasly et al. . | |
| 5,594,320 | 1/1997 | Pacholok et al. . | |
| 5,595,835 | 1/1997 | Miyamoto et al. . | |
| 5,595,839 | 1/1997 | Hossain . | |
| 5,599,636 | 2/1997 | Braun | 429/7 |
| 5,600,230 | 2/1997 | Dunstan . | |
| 5,602,481 | 2/1997 | Fukuyama . | |
| 5,610,495 | 3/1997 | Yee et al. . | |
| 5,612,153 | 3/1997 | Moulton et al. . | |
| 5,619,417 | 4/1997 | Kendall | 364/483 |
| 5,622,789 | 4/1997 | Young . | |
| 5,623,196 | 4/1997 | Fernandez et al. . | |
| 5,626,990 | 5/1997 | Miller et al. | 451/5 |
| 5,631,537 | 5/1997 | Armstrong . | |
| 5,633,573 | 5/1997 | Van Phoue et al. | 320/5 |
| 5,637,985 | 6/1997 | Nagai et al. | 320/25 |
| 5,643,044 | 7/1997 | Lund | 451/5 |
| 5,647,534 | 7/1997 | Kelz et al. . | |
| 5,648,713 | 7/1997 | Mangez | 320/6 |
| 5,650,240 | 7/1997 | Rogers . | |
| 5,652,498 | 7/1997 | Edye et al. | 320/6 |
| 5,652,502 | 7/1997 | Van Phoue et al. | 320/30 |
| 5,654,622 | 8/1997 | Toya et al. . | |
| 5,670,272 | 9/1997 | Cheu et al. | 429/162 |
| 5,824,432 | 10/1998 | Currle | 429/120 |

FOREIGN PATENT DOCUMENTS

| | | |
|---|---|---|
| 2 511 547 | 2/1983 | France . |
| 2 721 407 | 12/1995 | France . |
| 3246968 A1 | 7/1984 | Germany . |
| 4218381 C1 | 5/1993 | Germany . |
| 42 25 746 A1 | 2/1994 | Germany . |
| 94 15 874 U | 12/1994 | Germany . |
| 19618897 A1 | 11/1997 | Germany . |
| 59-091658 | 5/1984 | Japan . |
| 59-117061 | 7/1984 | Japan . |
| 59-139555 | 8/1984 | Japan . |
| 61-099278 | 5/1986 | Japan . |
| 63-062156 | 3/1988 | Japan . |
| 01320758 | 12/1989 | Japan . |
| 04294071 | 10/1992 | Japan . |
| 05166533 | 7/1993 | Japan . |
| 07250788 | 10/1995 | Japan . |
| 07282841 | 10/1995 | Japan . |
| 08115711 | 5/1996 | Japan . |
| 9-017416 | 1/1997 | Japan . |
| 1582979 | 1/1981 | United Kingdom . |
| 0 282 924 | 4/1995 | United Kingdom . |
| 2295718 | 6/1996 | United Kingdom . |
| WO 91/17451 | 11/1991 | WIPO . |
| WO 92/02963 | 2/1992 | WIPO . |
| WO 94/14206 | 6/1994 | WIPO . |
| WO 95/00978 | 1/1995 | WIPO . |
| WO 95/34824 | 12/1995 | WIPO . |
| WO 96/17397 | 6/1996 | WIPO . |
| WO 96/22523 | 7/1996 | WIPO . |
| WO 98/11620 | 3/1998 | WIPO . |

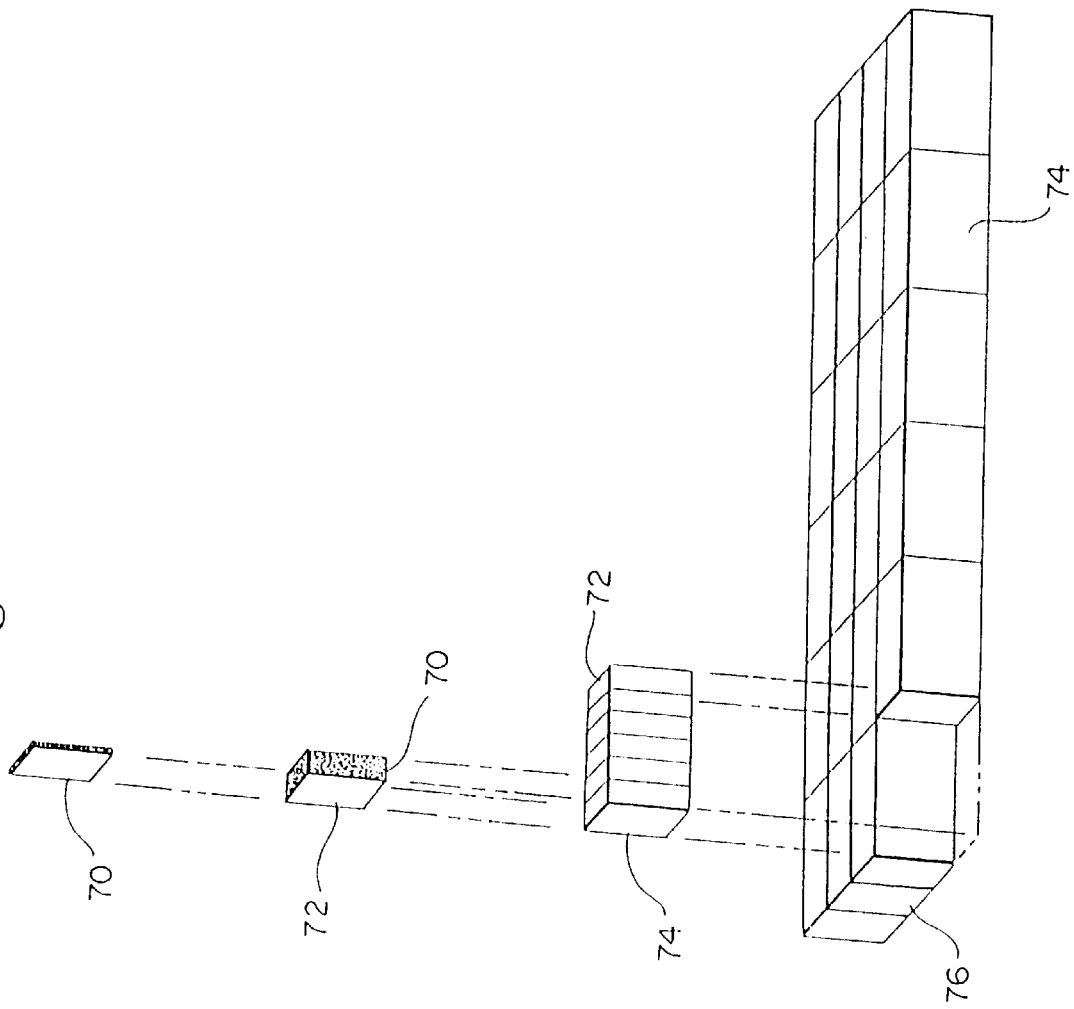

FAULT-TOLERANT BATTERY SYSTEM EMPLOYING INTRA-BATTERY NETWORK ARCHITECTURE

GOVERNMENT LICENSE RIGHTS

The Government of the United States of America has rights in this invention pursuant to Cooperative Agreement No. DE-FC02-91CE50336 awarded by the U.S. Department of Energy.

FIELD OF THE INVENTION

This invention relates generally to energy storage devices, and more particularly, to a distributed battery system employing an intra-battery communications network and fault-tolerant intelligence.

BACKGROUND OF THE INVENTION

A number of advanced energy storing device technologies have recently been developed, such as metal hydride (e.g., Ni—MH), lithium-ion, and lithium polymer cell technologies, which promise to provide high energy generation for a wide range of commercial and consumer applications. In high-energy applications, a substantial number of individual energy storing devices or cells are typically connected in series and parallel to produce higher voltages and current, respectively. Combining cells in this fashion increases the power capacity of the energy storing system. By way of example, it is believed that a battery system suitable for powering an electric vehicle will likely have a voltage rating on the order of several hundred volts, and a current rating on the order of several hundred amperes (A).

One approach to designing a high-power battery system involves connecting a number of self-contained energy storing devices together in a prescribed series and/or parallel arrangement to achieve a desired voltage and current rating. Using a modular approach in the construction of large battery systems generally provides for increased design flexibility and system maintainability. It can be appreciated, however, that increasing the number of individual energy storing devices within a given battery system increases the difficulty of determining the operating status of each device. The difficulty of detecting existing or imminent faults within the battery system and remedying such faults is also increased.

In a distributed battery system comprising several series connected energy storing modules each containing a number of electrochemical cells, for example, it is considered desirable to use cells which are equivalent or very similar in terms of electrochemistry and voltage/current characteristics. It is known that undesirable consequences often result during charging and discharging when an energy storage cell within a series string of cells exhibits characteristics that vary significantly from those of other serially connected energy storage cells. One adverse consequence, for example, involves the voltage of an anomalous energy storage cell within the series string, which can rapidly exceed a nominal maximum voltage limit during charging. Such an overvoltage or overcharge condition may damage the cell and significantly reduce the service life of the cell and other cells within the series connection.

It can be appreciated that the characteristics of mass manufactured energy storage cells will deviate to varying degrees from a given set of requirements. Further, cell characteristics, even if considered acceptable at the time of manufacture, will deviate from manufactured specifications at varying rates over time. In order to detect subtle and pronounced differences in cell chemistry and performance of a series string of modules or cells that constitute a distributed battery system, a comprehensive data acquisition scheme is needed to acquire sufficient information concerning individual module and cell operating conditions. Once acquired, this information must be processed and a corrective action strategy implemented to address anomalous operating conditions that arise in the distributed battery system.

There is a need in the battery manufacturing industry for an apparatus and method for orchestrating the operation of a number of individual series connected energy storing modules and cells, and for implementing a corrective action strategy to remedy faults occurring within the series connected modules and cells. There exists a further need for a distributed battery system that provides for safe and reliable operation in the presence of faults occurring within the battery system. The present invention fulfills these and other needs.

SUMMARY OF THE INVENTION

The present invention is directed to a distributed energy storing system employing a communications network. A distributed battery system includes a number of energy storing modules, each of which includes a processor and communications interface. In a network mode of operation, a battery computer communicates with each of the module processors over an intra-battery network and cooperates with individual module processors to coordinate module monitoring and control operations. The battery computer monitors a number of battery and module conditions, including the voltage and current state of the battery and individual modules, and the conditions of the battery's thermal management system. An over-discharge protection system, equalization adjustment system, and communications system are also controlled by the battery computer. The battery computer logs and reports various status data on battery level conditions which may be reported to a separate system platform computer.

A module transitions to a stand-alone mode of operation if the module detects an absence of communication connectivity with the battery computer. A module which operates in a stand-alone mode performs various monitoring and control functions locally within the module to ensure safe and continued operation. The module processor autonomously coordinates monitoring of current, voltage, and temperature conditions, effects bypassing of defective cells, equalizes cell voltages during charge and discharge cycles, and detects and logs fault conditions arising in the module. Module status information that is accumulated during the period of stand-alone operation is subsequently transmitted to the battery computer upon re-establishing communication connectivity between the module processor and battery computer.

BRIEF DESCRIPTION OF THE DRAWINGS

FIG. 2A is an illustration of various energy storing device configurations, including cell, cell pack, module, and battery configurations;

DETAILED DESCRIPTION OF THE EMBODIMENTS

Figure 1:
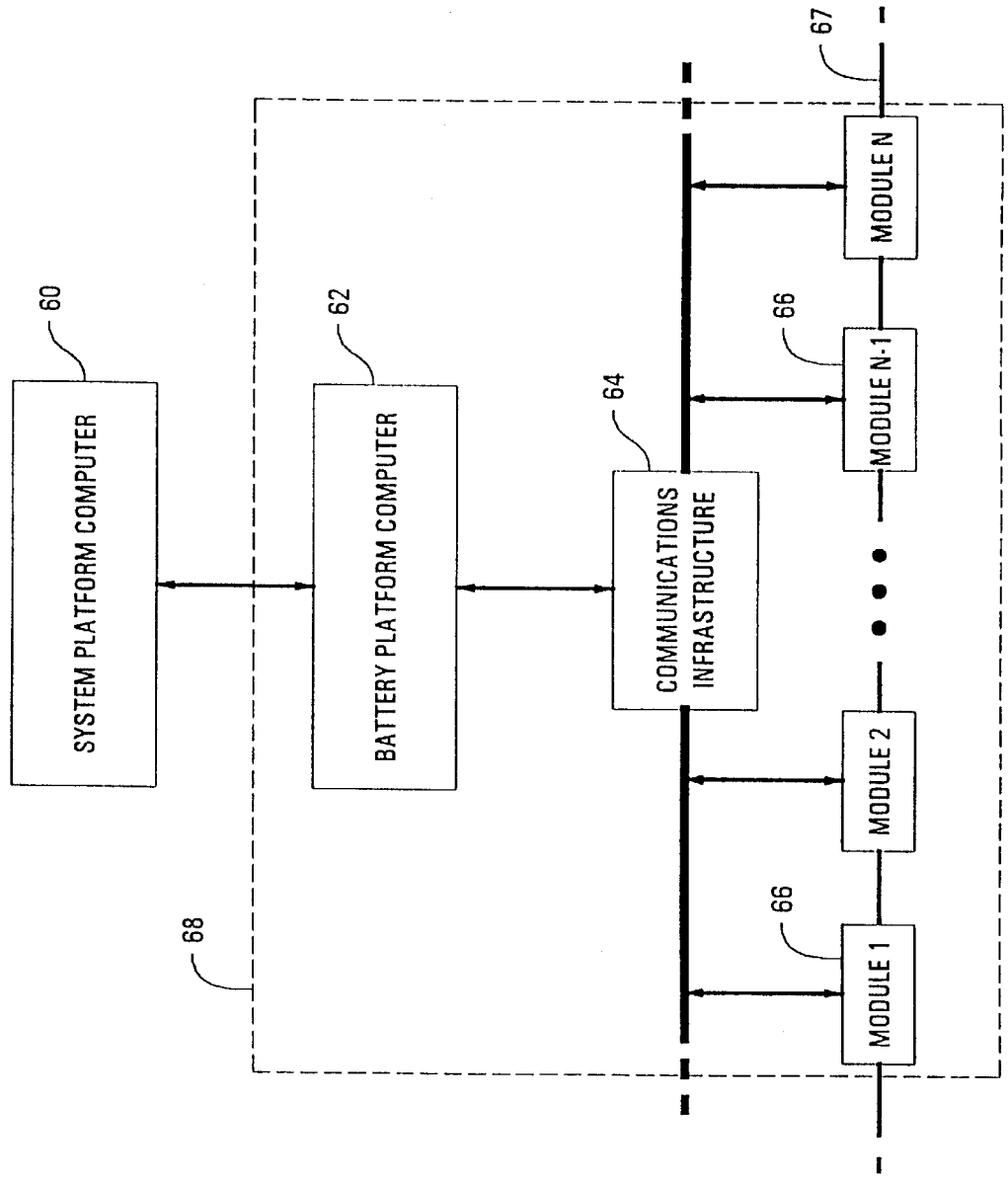
FIG. 1 illustrates an embodiment of a fault-tolerant distributed battery system including a number of energy storing devices connected in series.

Referring now to the drawings, and more particularly to FIG. 1, there is illustrated an embodiment of a fault-tolerant distributed battery system including a number of energy storing devices 66 which are shown being connected together in series by a power connection 67. Each of the energy storing devices 66 is also coupled to a communications infrastructure 64 through which communication between a battery platform computer 62 and the modules 66 is effected. Each of the modules 66 includes a processor or computer disposed therein which electrically communicates with the battery computer 62 over the communications infrastructure 64. In accordance with this configuration, the battery computer 62, communications infrastructure 64, and module 66 constitute an intra-battery network 68. The battery computer 62 may further communicate with a system platform computer 60.

In one embodiment, the battery computer 62 communicates control and configuration signals to the module 66 over the communications infrastructure 64 in order to coordinate the operation of the modules 66 during charging and discharging operations. Each of the modules 66 communicates status, fault, and other information to the battery computer 62. In response to the information received from the modules 66 and from other sources, the battery computer 62 controls various electrical and thermal management systems provided within the battery system and modules 66 to ensure that the battery system is operating nominally.

An important aspect of the distributed battery system depicted at FIG. 1 concerns the ability of the modules 66 to operate in a networked mode or in a stand-alone mode. In a typical scenario, a particular module 66 will transition from a networked mode to a stand-alone mode of operation in response to a fault occurring in the communications infrastructure 64 or battery computer 62 which causes the particular module 66 to become electrically or logically isolated from the battery computer 62. For example, a break in the communication link between the module 66 and the battery computer 62 typically prevents the battery computer 62 from effecting operational changes in the isolated module 66. In such a case, the isolated module 66 detects the absence of communication connectivity with the battery computer 62 and, in response, operates in a stand-alone mode.

A module 66 which operates in a stand-alone mode performs various monitoring and control operations locally within the module 66 to ensure safe and continued operation of the isolated module 66. In this regard, the distributed battery system shown in FIG. 1 may be viewed as a fault-tolerant system in which faults occurring at the battery platform level or between the battery computer 62 and individual modules 66 communicating over an intra-battery network 68 are effectively managed by the battery computer 62 or by each of the autonomous modules 66.

In accordance with one embodiment of a distributed battery system, an energy storing device or module well-suited for use in high-energy applications is constructed by selectively interconnecting a number of prismatic thin-film electrochemical cells in a parallel and/or series relationship to achieve a desired voltage and current rating. In the illustrative embodiment depicted in FIG. 2A, eight electrochemical cells 70 are grouped together and connected in parallel to form a cell pack 72. An energy storing device 74 is constituted by grouping six cell packs 72 together and connecting the packs 72 in series. A battery 76 may be constructed using 24 modules 74 connected in series.

Figure 3:
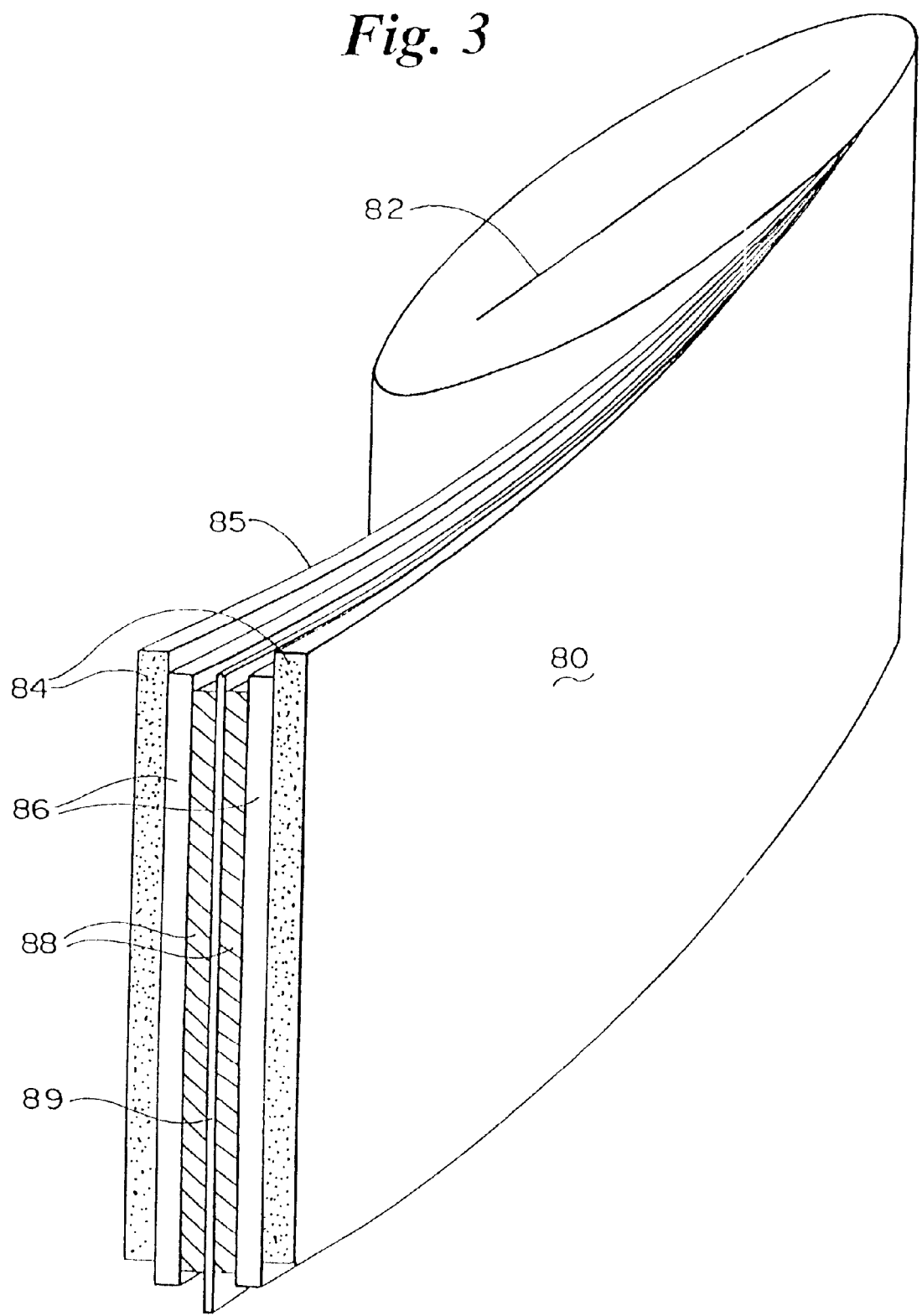
FIG. 3 illustrates an embodiment of a solid-state, thin-film electrochemical cell having a prismatic configuration.

An electrochemical cell which is employed as the basic energy producing element of an energy storing device may have a thin-film prismatic structure such as that illustrated in FIG. 3. In accordance with the embodiment illustrated in FIG. 3, the electrochemical cell 80 is shown as having a flat wound prismatic configuration in which a thin-film solid electrolyte 86 is disposed between a film 84 constituting an anode and a film 88 constituting a cathode. A central cathode current collector 89 is disposed between each of the cathode films 88 to form a bi-face cell configuration. A mono-face cell configuration may alternatively be employed in which a single cathode collector 89 is associated with a single anode/separator/cathode element combination. In this configuration, an insulating film is typically disposed between individual anode/separator/cathode/collector element combinations. The anode films 84 are laterally offset relative to the cathode current collector 89 so as to expose the anode 84 along a first edge 85 of the cell 80, and to expose the cathode current collector 89 along a second edge 83 of the cell 80. The embodiment shown in FIG. 3 includes a force producing core element 82 about which the thin-film electrochemical cell 80 is wound.

The electrochemical cell 80 shown in FIG. 3 may include a solid polymer electrolyte 86 which constitutes an ion transporting membrane, a lithium metal anode 84, and a vanadium oxide cathode 88. These film elements are fabricated to form a thin-film laminated prismatic structure, which may also include an insulation film, such as polypropylene film. A known sputtering metallization process is employed to form current collecting contacts along the edges 85, 83 of the anode and cathode current collecting films 84, 89, respectively. It is noted that the metal-sprayed contacts provide for superior current collection along the length of the anode and cathode film edges 85, 83, and demonstrate good electrical contact and heat transfer characteristics.

In general, the active materials constituting the solid-state, thin-film electrochemical cell illustrated in FIG. 3 retain chemical and mechanical integrity at temperatures well beyond typical operating temperatures. For example, temperatures of up to 180° C. may be tolerated. The electrochemical cells depicted generally in the figures may be fabricated in accordance with the methodologies disclosed in U.S. Pat. Nos. 5,423,110, 5,415,954, and 4,897,917.

Given the arrangements shown in FIG. 2A, and assuming that each of the electrochemical cells 70 has dimensions and characteristics equivalent to those depicted in FIG. 3, each individual cell 70 provides for a total energy output of approximately 36.5 Wh. Each cell pack 72 provides for a total energy output of approximately 292 Wh, while each module 74 provides for a total energy output of 1.75 kWh. A battery 76, constituted by 24 series connected modules 74, provides for a total energy output of approximately 42 kWh. It is understood that the structure and arrangement of electrochemical cells 70, and interconnection of cells 70 forming a cell pack 72, module 74, and battery 76 may vary from the arrangements illustrated in FIG. 2A.

Figure 4:
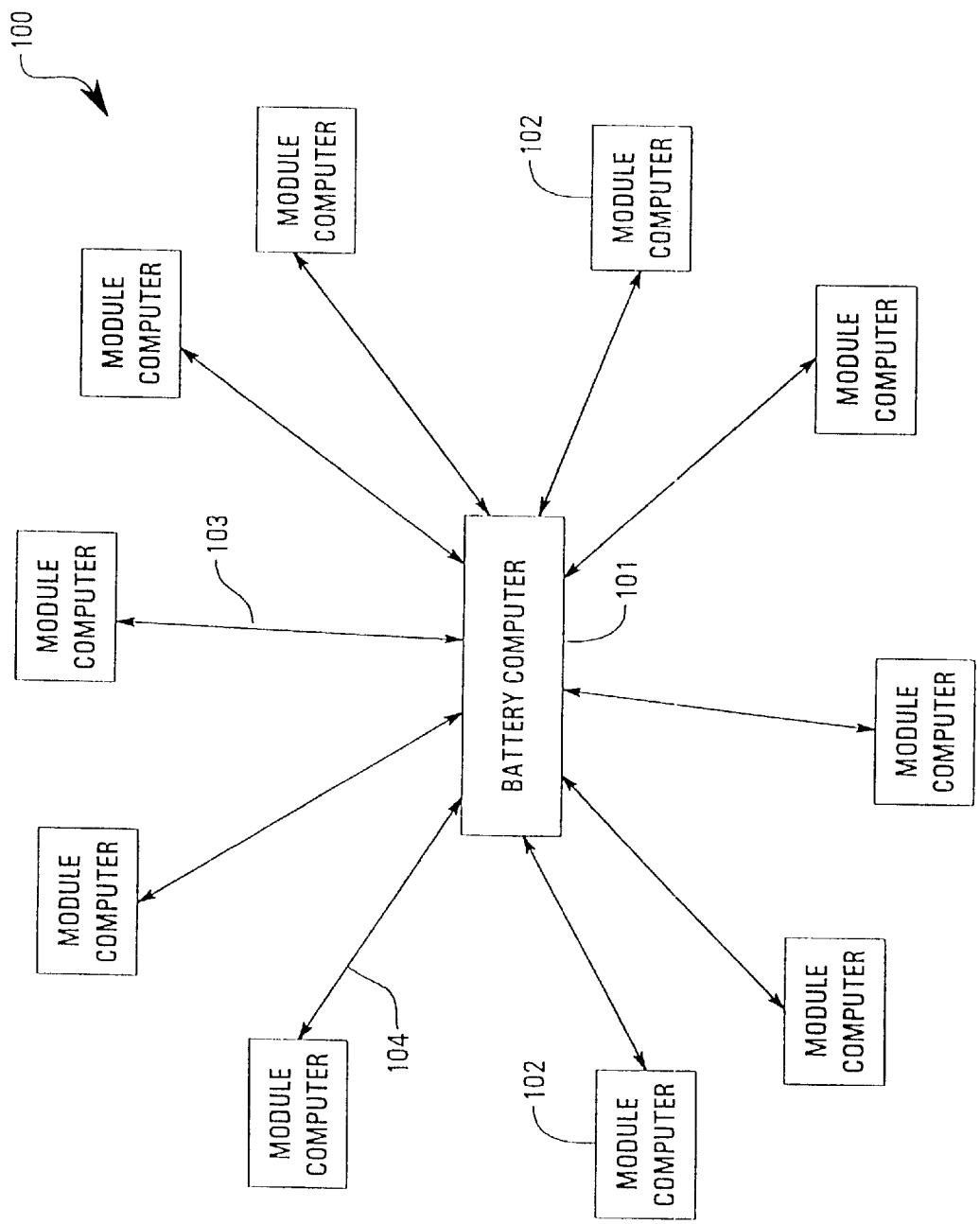
FIG. 4 is an illustration of an intra-battery communications network having a star topology for use in a fault-tolerant distributed battery system
Figure 5:
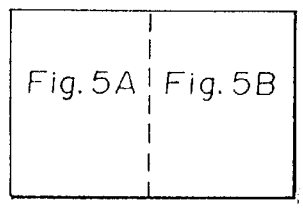
FIGS. 5–5B are more detailed illustration of an intra-battery communications network having a star topology.
Figure 5A:
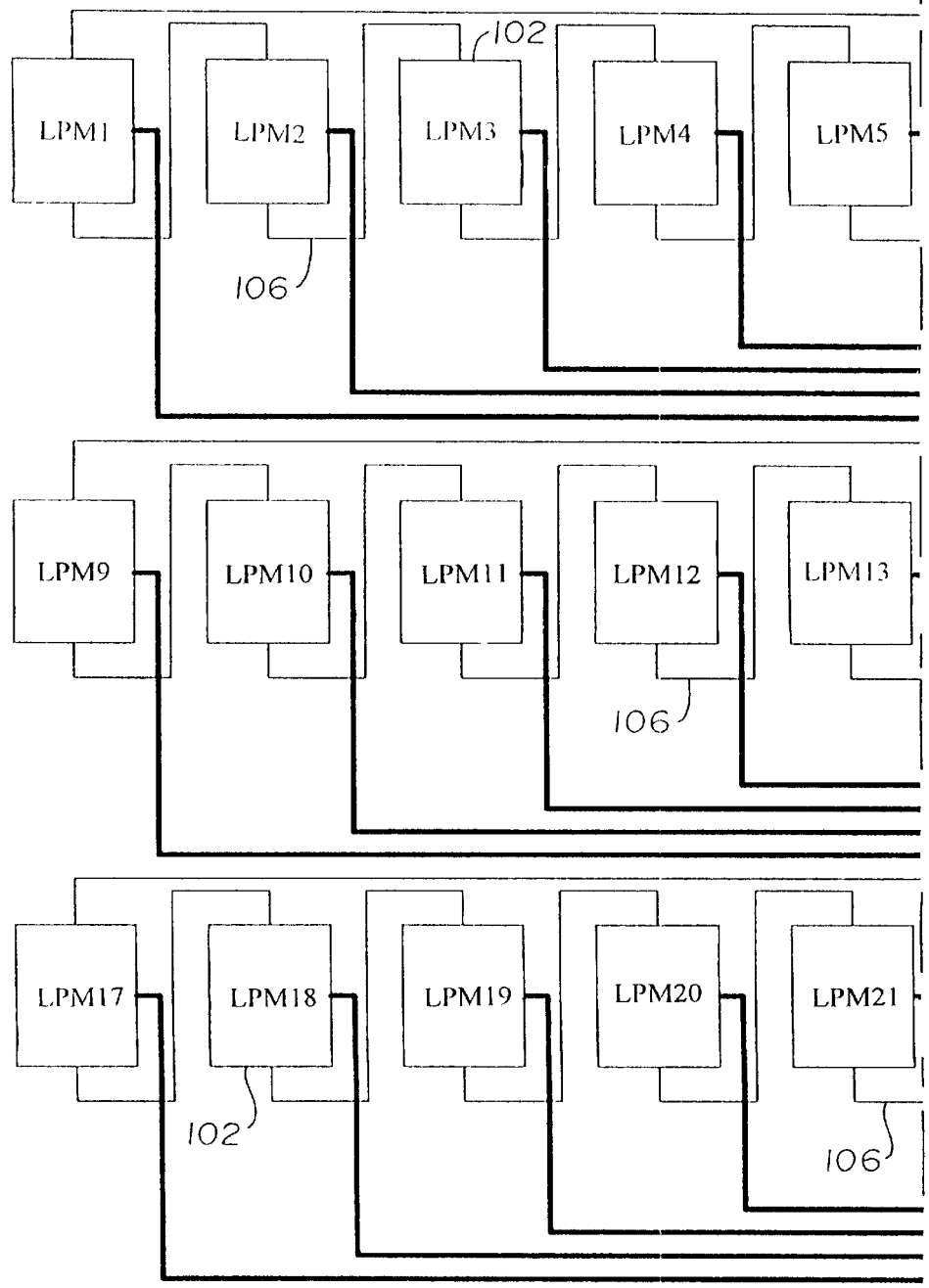
Figure 5B:
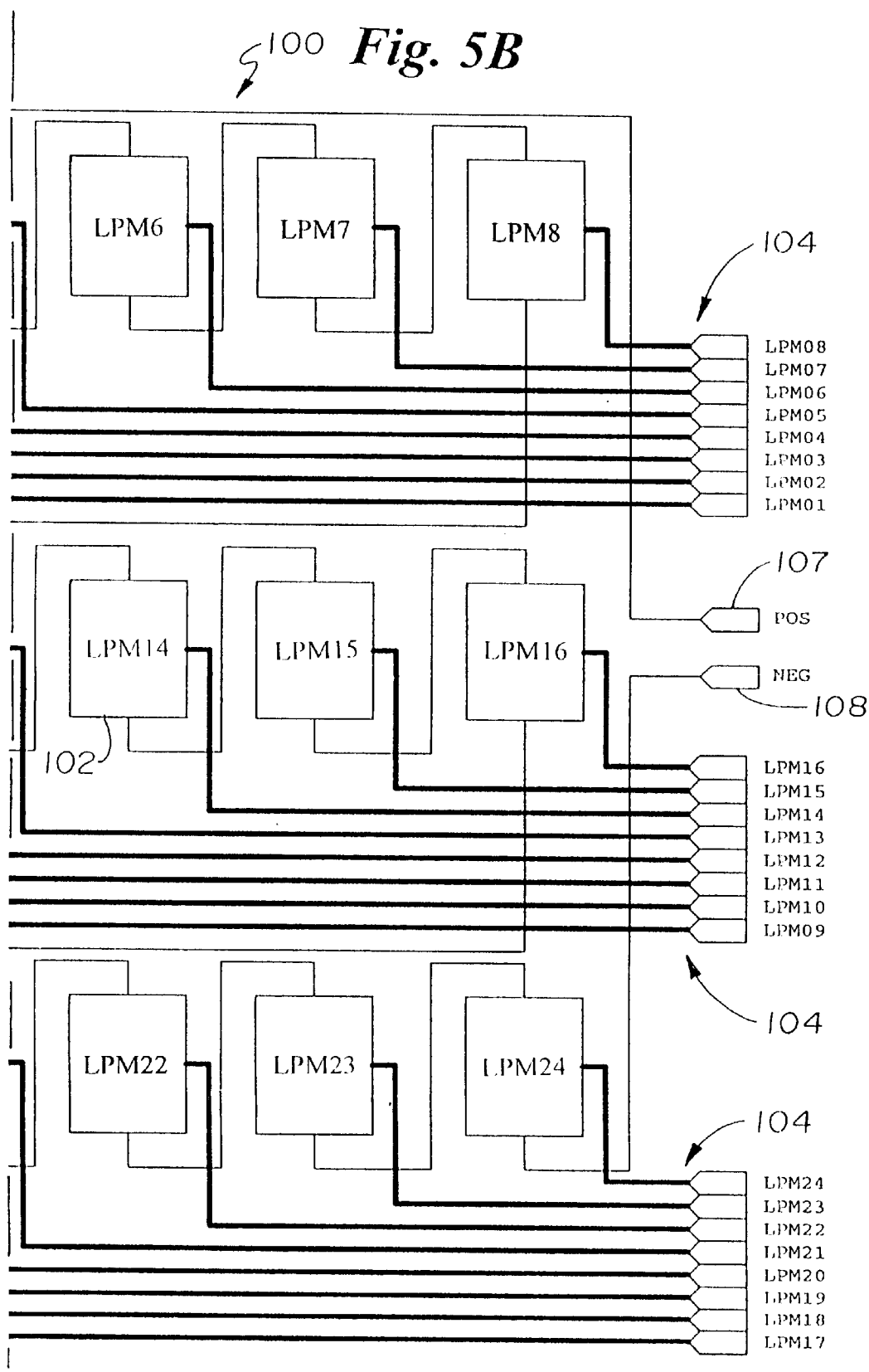

In FIGS. 4–5, there is shown an embodiment of a distributed battery system which incorporates an intra-battery network 100 arranged in a star configuration or topology. The star topology illustrated in FIGS. 4–5 provides pier-to-pier electrical connectivity between each of the module computers or controllers 102 and the central battery computer 101. An advantage to an intra-battery implementation that employs a star topology concerns an inherent protection from multiple transmission line failures. By way of example, if a communication link 103 between a particular module computer 102 and the battery computer 101 fails, a transmission line 104 connecting another module computer 102 with the battery computer 101 remains unaffected by the failure of the communication link 103. Connection problems are relatively easy to diagnose in a star-configured intra-battery network, such that the battery computer 101 can reliably identify the location of a defective communication link within the intra-battery network 100.

Another advantage of employing a star network topology includes the ease by which the physical location of a particular module 102 within the distributed battery system can be determined. As such, inserting a new or replacement module into the distributed battery system 100 does not require programming the physical location of the new or replacement module in the battery computer 101. FIG. 5 illustrates in greater detail the generalized star intra-battery network topology depicted in FIG. 4. The array of modules 102 shown in FIG. 5 are each connected to the battery computer 101 (not shown) by use of individual transmission lines 104. Additionally, the positive and negative terminals of the modules 102 are connected in series using a separate power line 106. The power line 106 terminates at positive and negative power terminals 107, 108.

Figure 6:
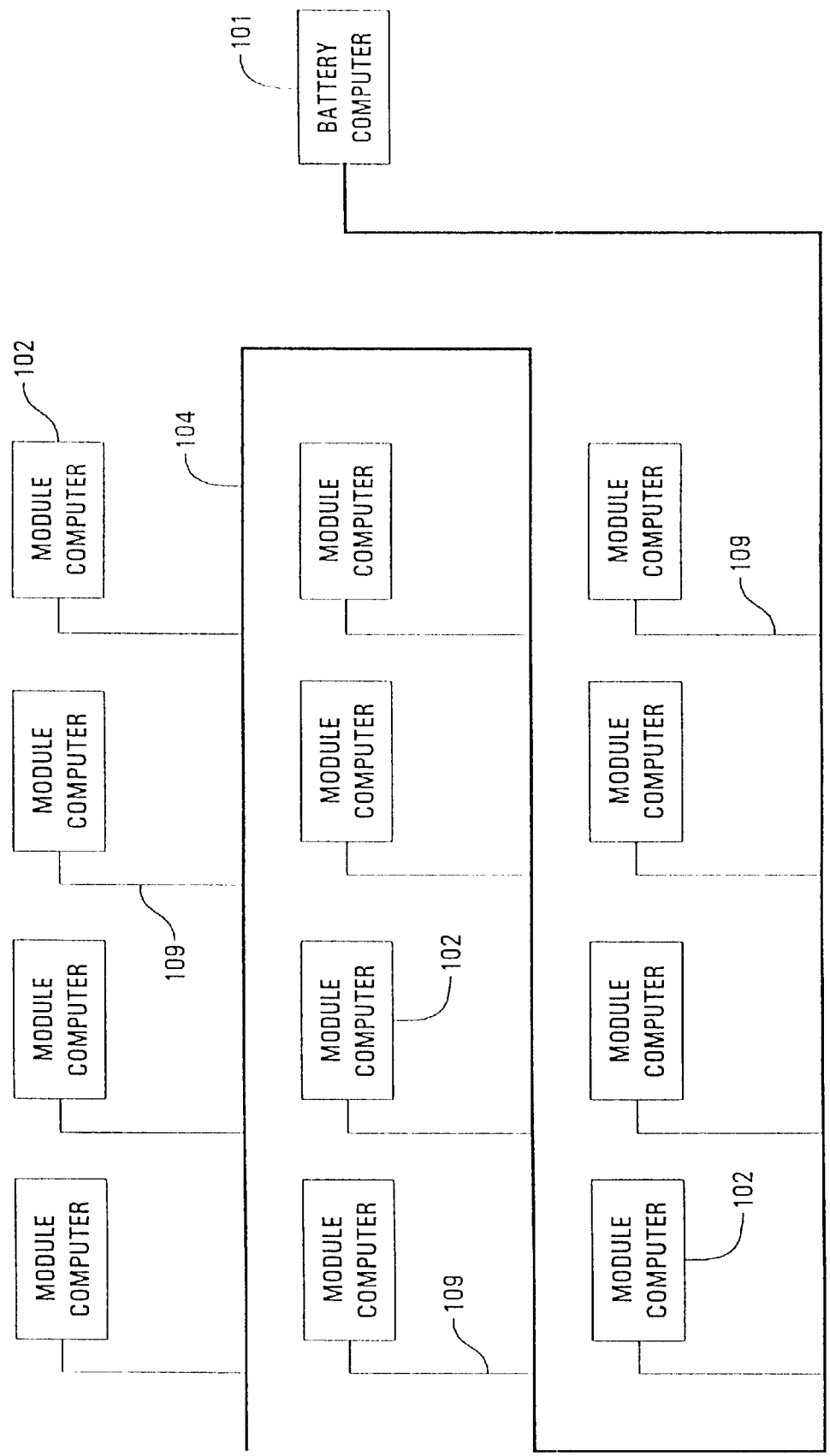
FIG. 6 illustrates an intra-battery communications network having a bus topology for use in a fault-tolerant distributed battery system.
Figure 7:
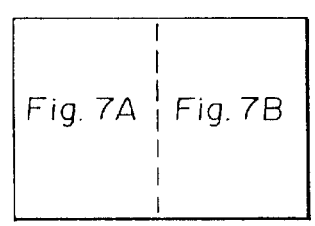
FIGS. 7–7B are more detailed illustration of an intra-battery communications network having a bus topology.
Figure 7A:
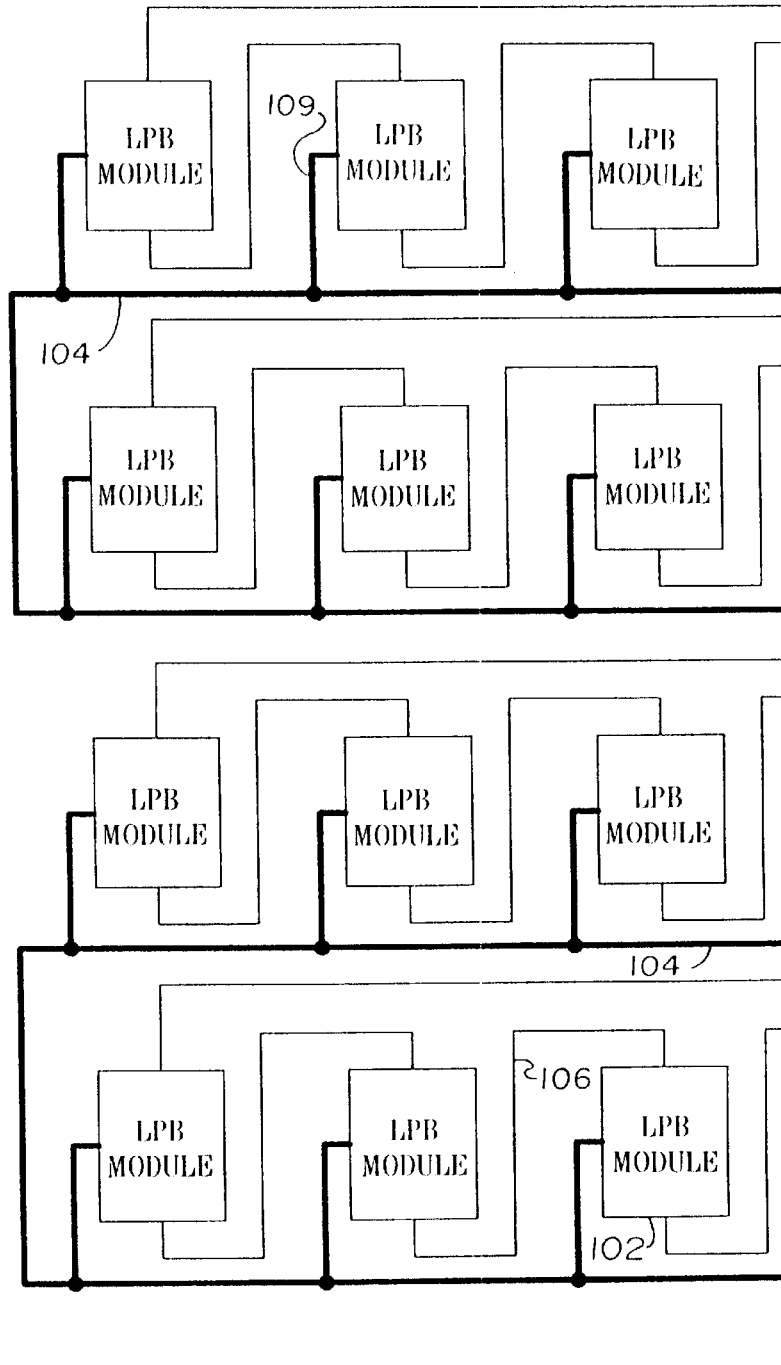
Figure 7B:
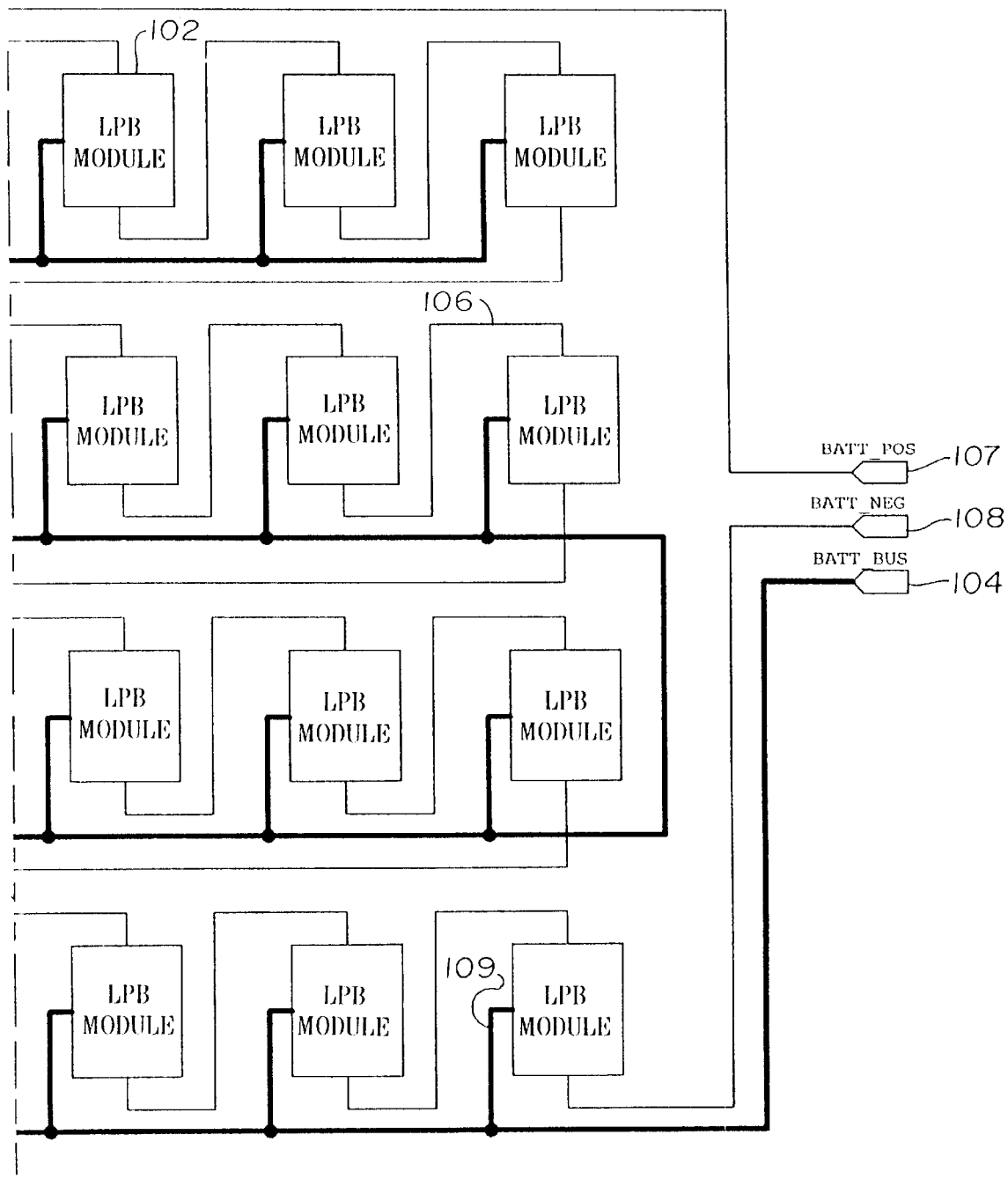

In FIGS. 6–7, an intra-battery network is depicted as having a bus configuration in which a single transmission line or bus 104 connects each of the module computers 102 with the battery computer 101. Each of the module computers 102 are connected to the bus 104 over a separate line 109. A suitable communication protocol which utilizes an arbitration scheme which may be employed in an intra-battery bus network, such as that shown in the embodiment illustrated in FIGS. 6–7, is defined in MIL STD 1553. As is also shown in FIG. 7, each of the modules 102 is connected to a series power connection 106 which terminates at positive and negative battery terminals 107, 108, respectively. It is understood that an intra-battery network topology other than the star and bus configurations illustrated in the figures may be employed to effect communication between the battery computer 101 and each of the module computers 102. For example, a star-configured ring, star/bus configuration, or other standard or hybrid topology may be employed.

It is anticipated that the rate of data transmission within an intra-battery network, independent of the particular network topology employed, will be relatively slow. In one embodiment, a 26-byte command structure is employed to communicate status and command parameters between the battery computer 62 and individual module computers 102. For example, in a distributed battery system which includes 24 energy storing devices 102, and assuming that a single command constitutes 26 bytes, the minimum bandwidth required to poll the 24 modules is 6,240 bits per second [(26 bytes/module)*(24 modules)*(10 bits/byte)*(P Hz)=6,240 *P bits/second]. It is noted that in this example, an asynchronous serial interface is employed.

A general equation for computing the minimum bandwidth, B, required to achieve a module polling frequency of P Hz is given by:

$$B=(x \text{ bytes/module})*(y \text{ modules})*(z \text{ bits/byte})*(P \text{ Hz}) \quad [1]$$

where, x represents the number of bytes according to the command and response format, y represents the number of individual modules constituting the distributed battery system, z represents the defined number of bits per byte, and P represents the polling frequency given in Hertz.

Table 1 below illustrates the bandwidth of the communications infrastructure 64 required to transmit information across the intra-battery network 100 at various polling frequencies, P Hz. It is noted that the bandwidth values provided in Table 1 do not include all protocol overhead, which may require additional overhead of up to 25%.

TABLE 1

| FREQUENCY (P) | BANDWIDTH |
|---|---|
| 0.1 Hz | 624 bits/second |
| 1.0 Hz | 6240 bits/second |
| 10 Hz | 62400 bits/second |
| 100 Hz | 624000 bits/second |

Illustrative sets of battery computer commands and module computer responses in accordance with one embodiment of the present invention are respectively provided below in Tables 2 and 3:

TABLE 2

| BYTE NO. | INFORMATION |
| --- | --- |
| Byte 1 | Module Address |
| Byte 2–3 | Command |
| Byte 4–5 | CRC Check Byte |

TABLE 3

| Byte No. | Information |
| --- | --- |
| Byte 1 | Module Address ID |
| Byte 2–5 | Temperature |
| Byte 6–11 | Cell Pack Terminal Voltages |
| Byte 12 | Module Case Voltage |
| Byte 13 | Module Terminal Current In |
| Byte 14 | Module Terminal Current Out |
| Byte 15 | Bypass Device Status |
| Byte 16 | Warning And Service Request To Battery |
| Byte 17 | Serial Number |
| Byte 18–21 | CRC Check Byte |

When a module is disconnected from the intra-battery network, such as when maintenance or replacement of a particular module is required, a new module having a unique identification, such as a unique serial number, is registered with the computer platform battery 101. In an intra-battery network having a bus topology, registering the identity of a new module inserted into the intra-battery network may be accomplished manually by a battery technician programming the physical location of the replacement module into the battery computer.

Alternatively, each connector provided on the bus may have associated with it a location identifier which is unique within the intra-battery network. An identification circuit may be incorporated or coupled to the bus connector which encodes the unique location identification information into the information transmitted between a particular module and the battery computer 101. It is appreciated that employment of a star network topology obviates the need to identify the physical location of each module within the network.

An intra-battery network employing a star topology offers a number of advantages over a bus topology. For example, since each transmission line on a star network has a known physical location, the physical location of each of the modules communicating over the star network is known. A bus configuration, in contrast, requires additional hardware at each module in order to determine where each module is located within the intra-battery network. Further, all nodes that communicate on a bus network must follow a stringent protocol which increases processing overhead and memory usage. Moreover, a short-circuit that develops within a bus-configured network could potentially terminate all communications between the modules and the battery computer. An open-circuit condition on the bus will typically disconnect the battery computer from all other modules physically located beyond the open-circuit.

A disadvantage associated with a star network topology concerns the number of connectors which are known in the art to have high failure rates. A star configuration, in comparison to a bus topology, requires more connectors at the battery platform level, but the number of pins per connector may be less at the module level. As such, the number of overall contacts required to effect communications between the battery computer 101 and the module computers 102 may be approximately equal for either topology.

Figure 8:
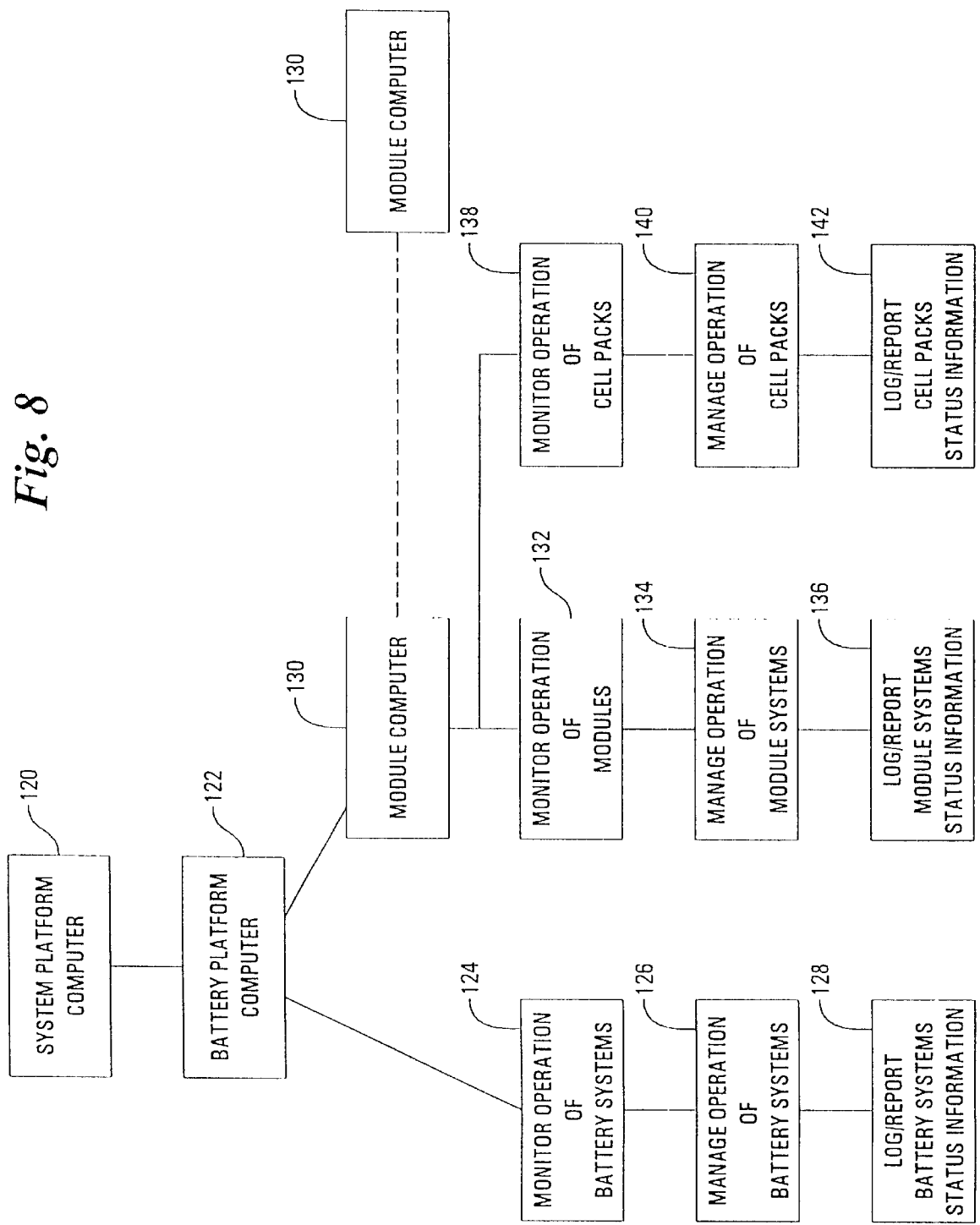
FIG. 8 illustrates various operations performed by module and battery computers which communicate over an intra-battery communications network.

In FIG. 8, there is illustrated an embodiment of a fault-tolerant distributed battery system in which a battery computer 122 communicates with a number of module computers 130 and also with a system platform computer 122. In accordance with one embodiment, the distributed battery system is employed as the primary power source for an electric vehicle. In this configuration, the battery computer 122 communicates with the system platform computer 120 using a communications protocol that is equivalent to, or complementary with, the protocol used to effect communications between other devices within the electric vehicle. For example, the "Surface Vehicle Standard SAE-J 1850" specification or "Vehicle Area Network (VAN)" protocols may be employed. Alternatively, a protocol translator or bridge may be employed to effect translation between non-compatible protocols. It is understood that a hierarchical battery system described herein may be employed in systems other than an electric vehicle, such as in telecommunications systems and aerospace systems, for example.

As is further shown in FIG. 8, the battery computer 122, in combination with a number of module computers 130, provides for the monitoring, controlling, and reporting of operations within the distributed battery system. Individual modules are capable of operating autonomously in a stand-alone mode as well. The battery computer 122 monitors 124 a number of battery system conditions, including the potential and electric current status of the battery and the conditions of the battery's thermal management system.

A number of battery level systems are managed or coordinated 126 by the battery computer 122, including an over-discharge protection system, thermal management system, equalization adjustment system, and communication control system, for example. The battery computer 122 also logs and reports 128 various status data on battery level conditions, including voltage, "fuel" remaining, maintenance and service recommendations and history, temperatures, and other information required by the system platform computer 120.

Each of the modules, as discussed previously, includes a microprocessor or computer 130 which provides for both stand-alone operation and cooperative operation with the battery computer 122. Each of the module computers 130 monitors 132 various operations and status conditions within the module, including potential, current, and temperature conditions. Additionally, the number of bypassed cell packs and other fault conditions are monitored 132 by the module. Further, equalization potentials, such as the maximum and minimum cell pack voltages within a module, are monitored by the module computer 130.

The module computer 130 controls 134 a number of module level functions, including effecting a bypass of a defective cell pack and facilitating equalization of potentials of the cell packs contained within the module during charging and discharging operations. Various module status information is logged or reported 136 by the module computer 130, including fault conditions, number of active cell packs, warranty data, serial number information, and other information requested by the battery computer 122. The module computer 130 provides for the monitoring 138, managing 140, and reporting of status information 142 down to the individual cell pack level.

Figure 9:
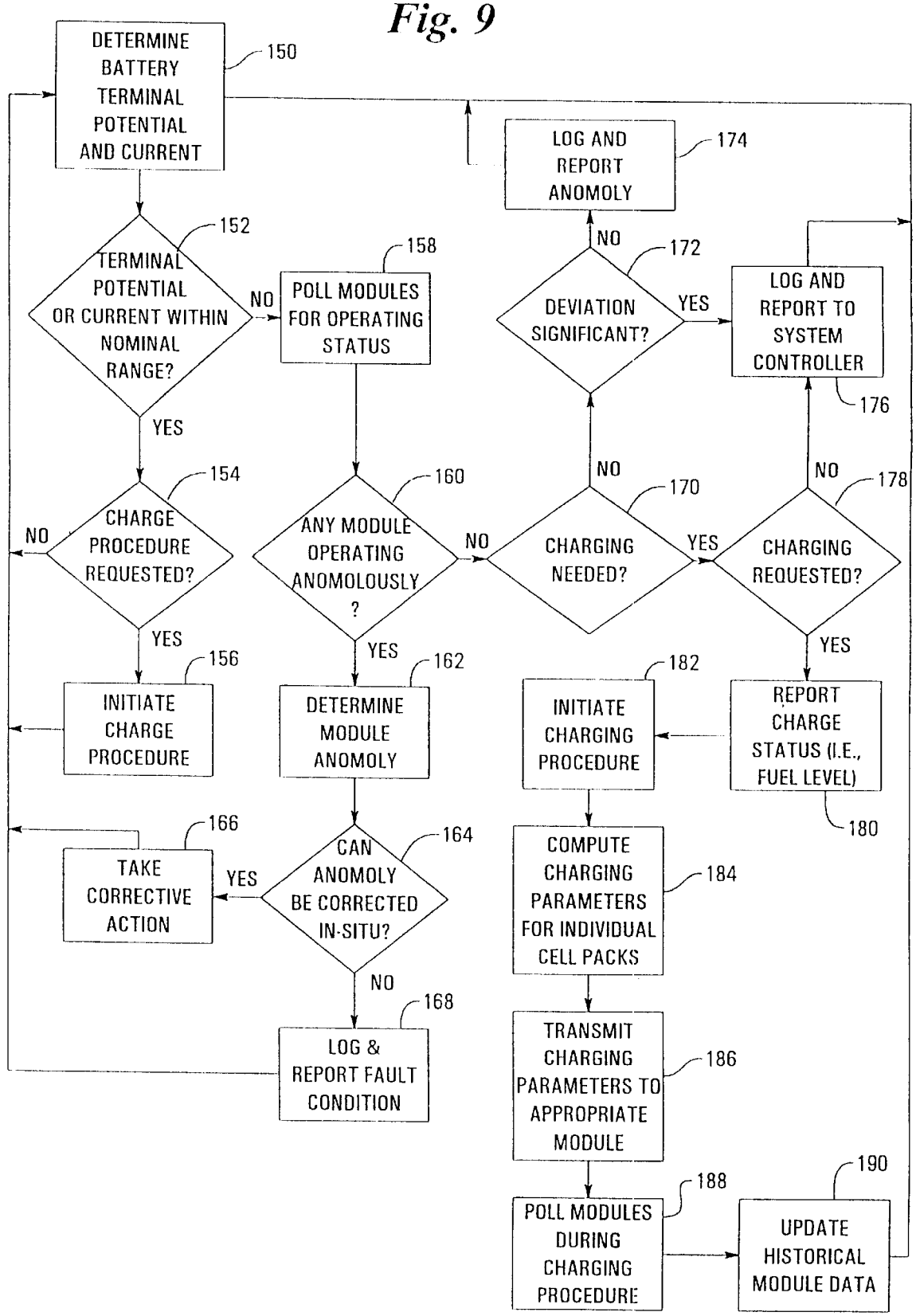
FIGS. 9–11 depict in flow diagram form many of the operations coordinated by the battery computer and module computers of a fault-tolerant distributed battery system.

In FIG. 9, there is illustrated in flow-chart form various operations managed by the battery computer 122 of a fault-tolerant, distributed battery system, such as that shown in FIG. 8. The battery computer 122 determines the battery potential and current 150 on a regular basis. If the terminal potential and current are within a nominal range 152, monitoring of these parameters continues until an anomalous condition arises or if a charge procedure is requested 154. The battery computer 122 initiates a charge procedure 156 upon receiving a charge request command typically from the system platform computer 120. Terminal and current parameters are continuously monitored 150 during and after termination of the charge procedure 156.

If the battery computer 122 determines that the terminal potential or current is not within a nominal range 152, the battery computer 122 polls 158 each of the modules connected to the intra-battery network in order to determine the operating status of the modules. In one embodiment, the battery computer 122 interrogates each of the module computers 130 using a master/slave polling technique. In this configuration, it is assumed that the modules do not communicate with each other, but only with the battery computer 122. As such, a master/slave protocol with the battery computer 122 operating as the master device is appropriate. In an alternative embodiment, it may be desirable to provide a communication connection between individual module computers 130 in addition to providing connectivity between the module computers 130 and the battery computer 122. In this configuration, an isolated module operating in a stand-alone mode can communicate with the battery computer 122 through another module which is operating in a networked mode.

In one embodiment, the module computers 130 continuously effect various measurements and module status determinations at a predetermined rate. Upon receiving a command from the battery computer 122, each of the module computers 130 responds to the command by transmitting the requested information through the intra-battery network to the battery computer 122. The rate at which the battery computer 122 polls 158 the module computers 130 may be determined by considering the number of modules within the distributed battery system and the quantity of information communicated between the module computers 130 and battery computer 122. A polling rate of once per second, for example, may be sufficient for a intra-battery network having 24 module nodes.

If the battery computer 122 determines 160 that any module is operating in an anomalous manner, the battery computer 122 determines the cause of the anomaly 162 and attempts to remedy the anomalous condition. If the anomaly can be corrected in-situ 164, such as by effecting a bypass of a defective or short-circuited cell pack, the battery computer issues a corrective action command 166 to the affected module computer 130. If the anomalous condition cannot be corrected, the battery computer 122 logs the fault condition 168 and reports the fault condition to the system platform computer 120. Depending on the criticality of the fault condition, the system platform computer 120 may activate an annunciator or other alert mechanism which calls attention to the particular fault condition.

If the terminal potential or current is not within a nominal operating range 152, and none of the modules are operating in an anomalous manner 160, the battery computer 122 may determine that module charging is required 170. If the battery computer 122 determines that charging is not required, and that the source of the anomalous terminal potential or current condition cannot be determined, the anomalous condition is logged and reported 174 in the battery computer 122 if the deviation from nominal conditions is not significant 172. If the terminal potential or current deviates significantly with respect to a pre-established threshold, then the anomalous condition of unidentified origin is logged in the battery computer 122 and reported to the system platform computer 120 for further evaluation. The system platform computer 120 may take further action to call attention to the anomalous condition depending on the severity of the condition.

If the battery computer 122 determines that charging of the modules is needed 170, a low fuel signal is communicated to the system platform computer 120 which annunciates the low fuel status condition. If the system platform computer 120 ignores or overrides the charge request issued by the battery computer 122, the low fuel condition is logged and reported 176 in the battery computer 122 and typically the system platform computer 120. If a charge request command signal is received from the system platform computer 120, the fuel level status is reported 180, as well as the estimated time to complete the charging procedure.

The battery computer 122 initiates the charging procedure 182 typically by polling each of the module computers 130 to determine the potentials of individual cell packs within the modules. The battery computer 122 computes charging parameters 184 based on the acquired cell pack voltage information, and transmits 186 charging parameters to the various module computers 130. The status of the modules is monitored 188 by the battery computer 122 during the charging procedure. Upon completion of the charging procedure, historical data concerning each of the modules is updated 190, such as the potential of the module after charging, and the total number of charge/discharge cycles. After completion of a charging procedure, the battery computer 122 resumes normal operation, which includes monitoring 150 battery terminal potential and current.

Figure 10:
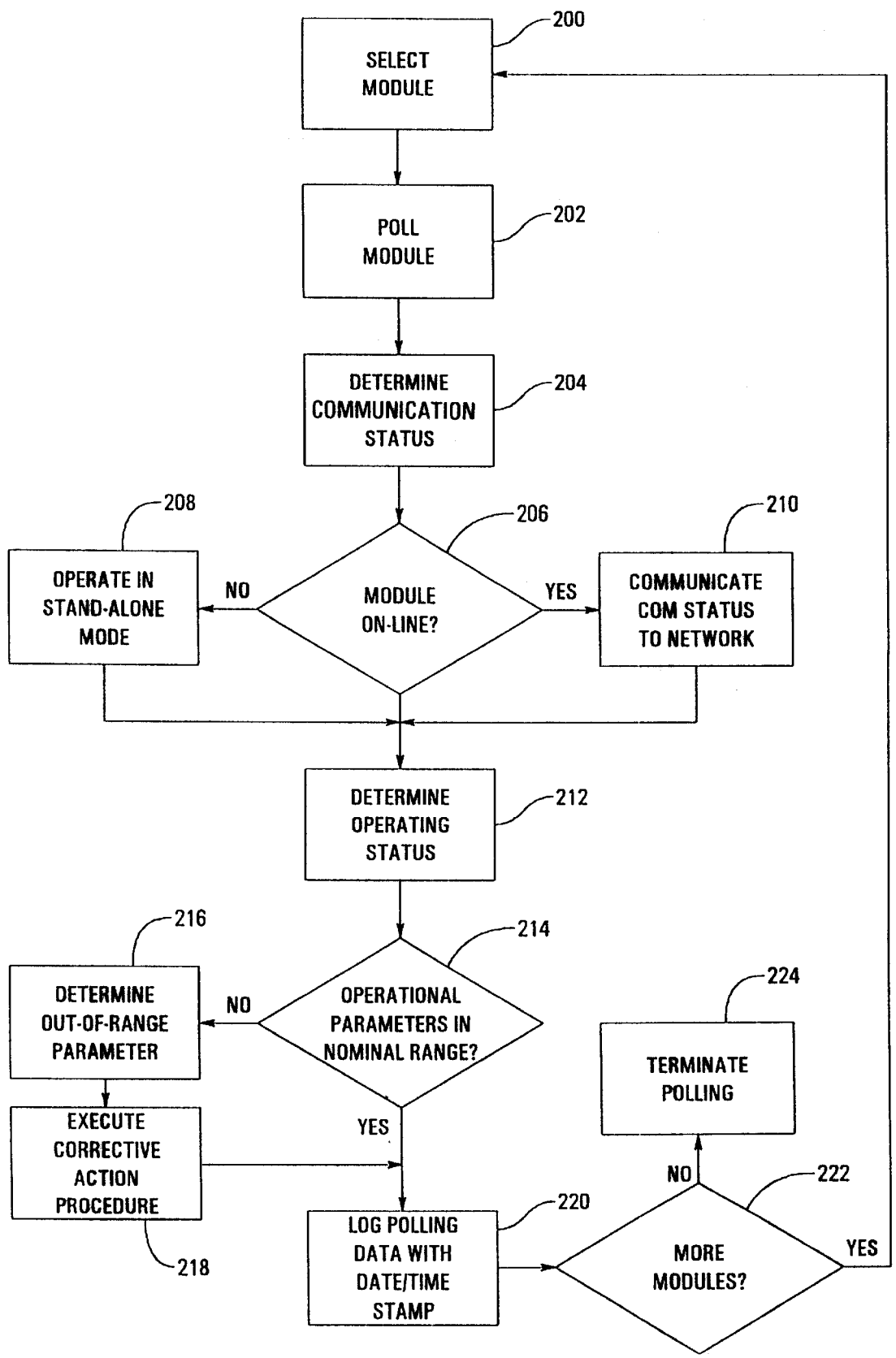

The flowchart provided in FIG. 10 describes various process steps taken by the battery computer 122 when polling the modules communicating over the intra-battery network. The battery computer 122 selects 200 a module within the distributed battery system and polls 202 the module to determine 204 the communication status of the selected module. If the module is on-line or accessible via the intra-battery network 206, the module communicates 210 its present ability to communicate with the network. Each of the modules will typically determine whether communication with the battery computer is possible. If a particular module determines that communication with the battery computer is not possible, the particular module operates 208 in a stand-alone mode until such time as the module re-establishes communication with the battery computer. In a stand-alone mode of operation, as discussed previously, a module typically monitors potential, current, and temperature parameters, effects bypassing of defective cell packs, equalizes cell pack voltages during a charging and discharging operations, and detects and logs fault conditions arising in the module.

In either a network or stand-alone mode of operation, the operating status of the module is determined 212 and out-of-range operational parameters are detected 214, 216, with corrective action being taken 218 in response thereto. Operational data is logged 220 in either or both of the module and battery computers with corresponding date and time stamp information. The battery computer continues the polling procedure if additional modules have yet to be interrogated 222, until such time as the polling procedure is terminated 224. It is noted that the polling procedure may be conducted on a continuous basis, or on a selected basis upon detection of an anomalous condition within the distributed battery system.

Figure 11:
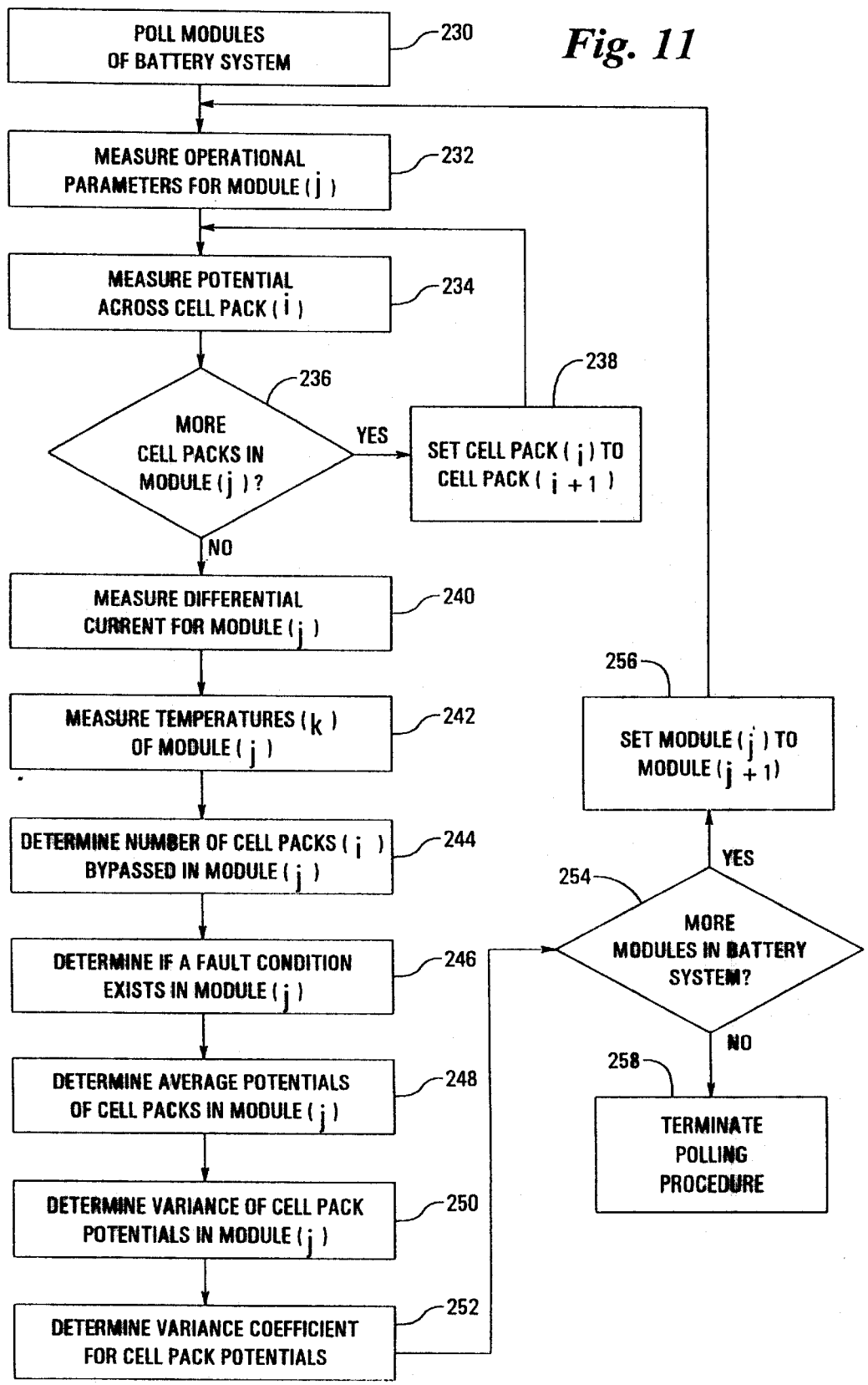

In FIG. 11, there is illustrated in greater detail various process steps executed by the battery computer when polling an arrangement of energy storing devices constituting the distributed battery system. When the battery computer polls 230 a particular module within the battery system, various operational parameters for the module are measured 232. In a module configuration in which a number of cell packs are connected to one another within the module, each of the individual cell packs is polled to determine the voltage across each respective cell pack 234, 236, 238. After determining the potential of each of the cell packs, a differential current for the particular module is measured 240, which is used as a basis for detecting various types of module fault conditions. The differential current for a module is given by the difference between the current detected through the positive terminal of the module and the current through the negative terminal of the module (i.e., $I_{Pos}-I_{Neg}$)

A module typically includes a number of temperature sensors distributed at various locations within the module from which temperature values are determined 242. The number of cell packs that have been bypassed in the module is determined 244, as well as any fault conditions which exist in the module 246. The average potential of the cell packs in a particular module is determined 248 using the values of cell pack voltages previously obtained. The variance of cell pack potentials in the modules, and a variance coefficient indicative in the distribution or spread of cell pack potentials is determined 250, 252. The above-described information or determinations relative to the various module operational parameters are then stored in the module and in the battery computer. If additional modules are to be polled 254, the battery computer selects the next module 256 and repeats the various aforementioned measuring and detecting operations, otherwise the polling procedure is terminated 258.

In Table 4 below, there is provided various types of data which is acquired by various components of the distributed battery system, and the particular component from which the data is obtained. Also provided is a description of how the data is obtained or measured, to which component the data is reported, and the components which store particular data. The term "x" identifies the particular battery system component associated with originating, measuring, reporting, or storing the particular data element. The term "(x)" indicates that a particular function is executed by the indicated module component. The term "O" indicates that the implicated energy storage device component typically reports or stores the particular data element, but that other components may also report or store these data elements. It is to be understood that the information provided in Table 4 is associated with one of many possible embodiments of a data acquisition process effected by a fault-tolerant distributed battery system configured and operating in accordance with the principles of the present invention.

TABLE 4

| Data | Originally Occurs At | | | | Measured (Actuated) At | | | | Data Reported To | | | | Data Stored At | | | |
| --- | --- | --- | --- | --- | --- | --- | --- | --- | --- | --- | --- | --- | --- | --- | --- | --- |
|  | C | P | M | B | C | P | M | B | P | M | B | S | P | M | B | S |
| Term. Pot. |  | X | X | X |  | X |  |  |  | X | X | X |  | X | X | X |
| Batt. Curr. | X | X | X | X |  |  | X | X |  | X | X |  |  | X | X |  |
| Fault |  | X | X |  |  |  | X |  |  | X | X |  | X | X | X |  |
| Batt. Temp. |  |  | X |  |  |  | X |  |  | O | X | X |  | O | X | X |
| Mod. Temp. |  |  | X |  |  |  | X |  |  | X | X |  |  | X | X |  |
| CELL PACK Low Pot. | X | X |  |  |  | X |  |  |  | X | O | O | X | X | O |  |
| CELL PACK By-Pass |  | X |  |  |  | (X) |  |  |  | X | X | O | O | X | X | O |
| CELL PACK Set-Point |  |  | X |  |  |  | (X) |  |  | X | X |  |  | X |  |  |
| Fluid Level |  |  | X |  |  |  |  |  |  |  | X |  |  |  | X |  |

C = Cell
P = Cell Pack
M = Module
B = Battery
S = System

Figure 12:
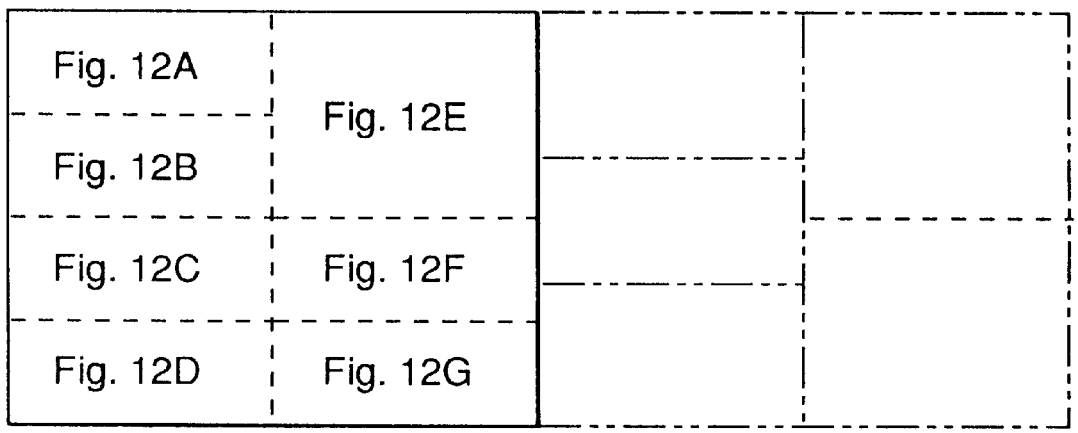
FIGS. 12–13B are schematic illustrations of electronic monitoring and control circuitry which is incorporated within an energy storing module of a fault-tolerant distributed battery system in accordance with one embodiment of the present invention.
Figure 13:
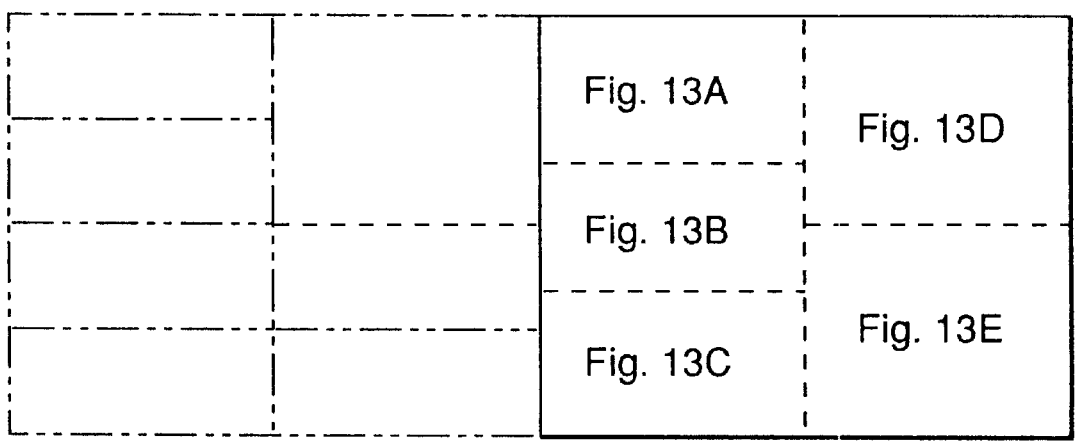
Figure 12A:
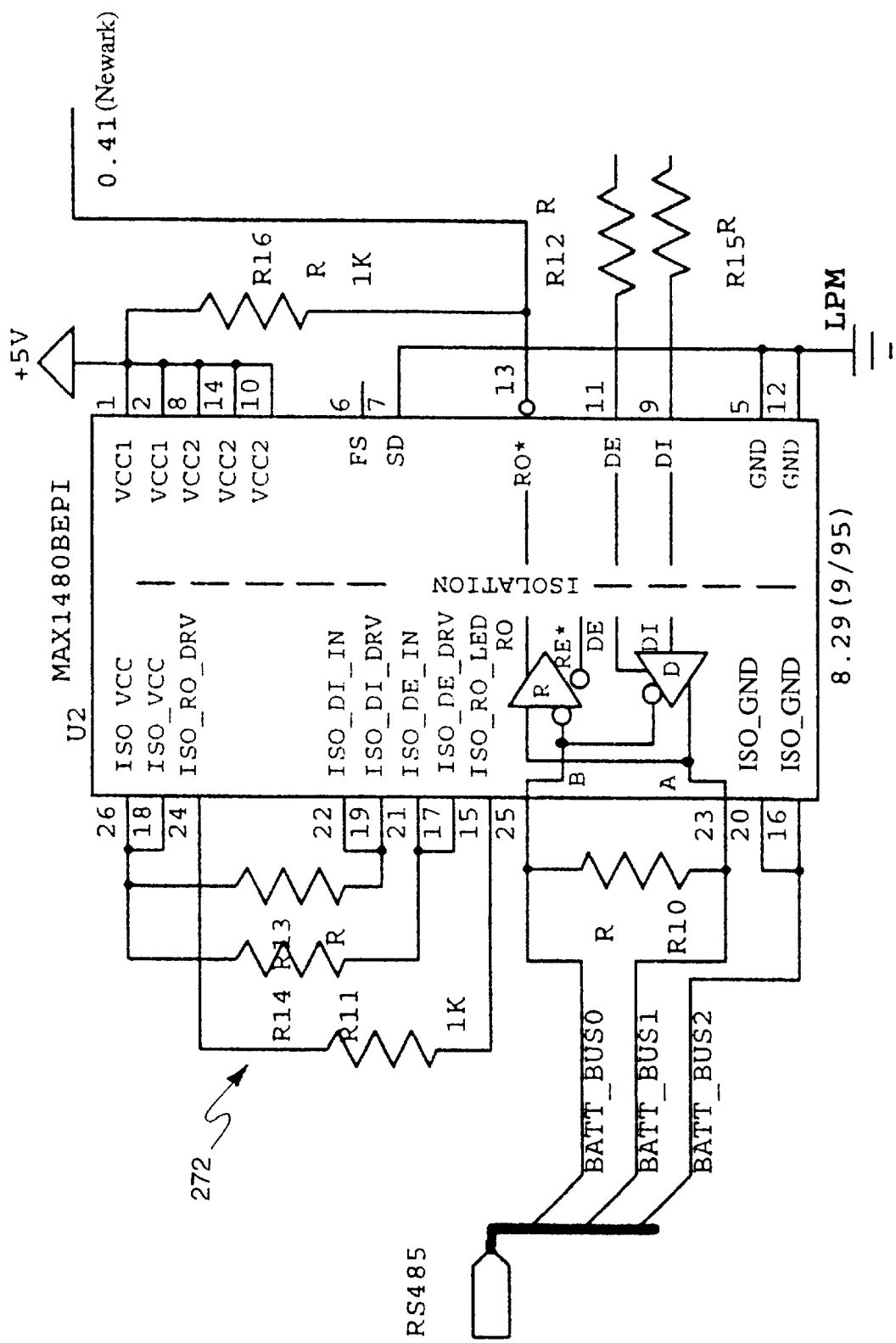
Figure 12B:
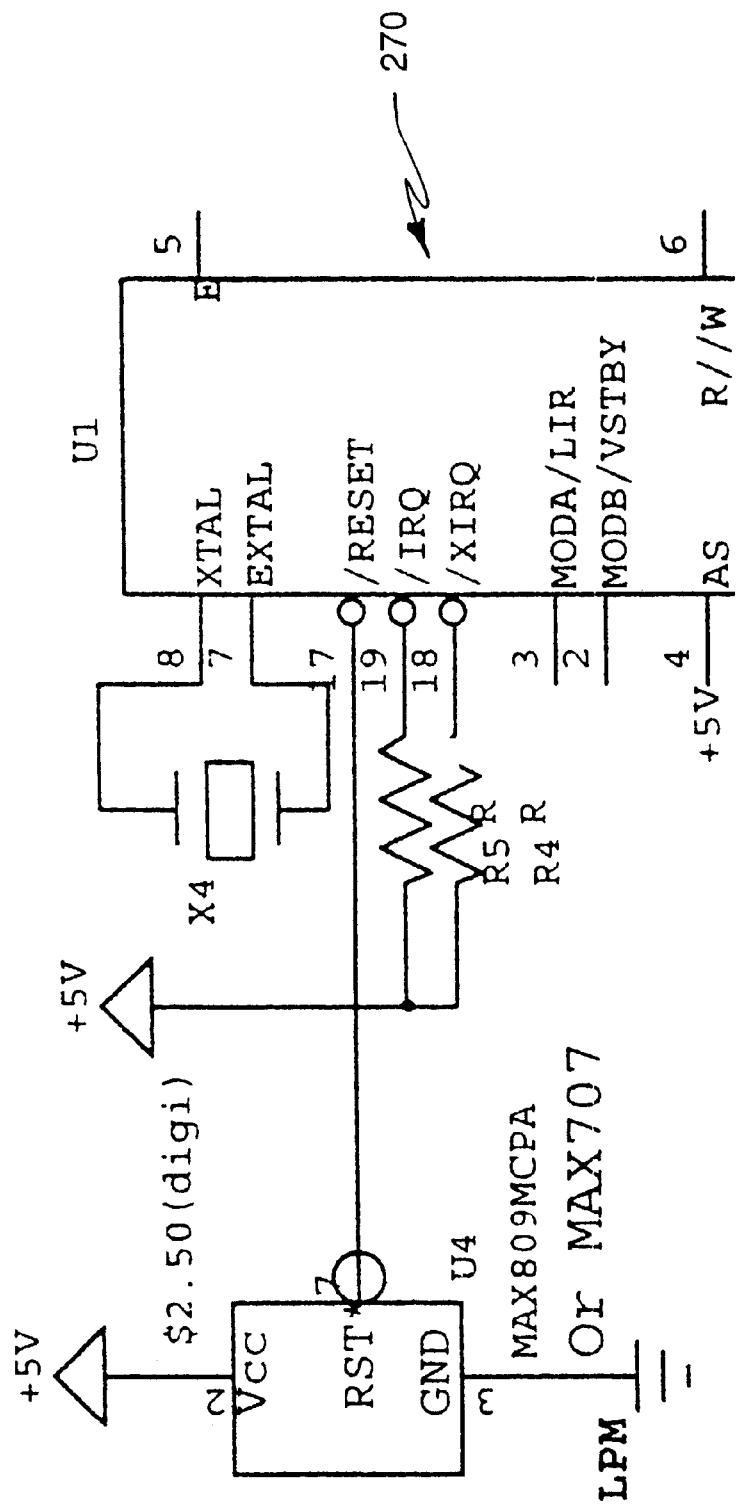
Figure 12C:
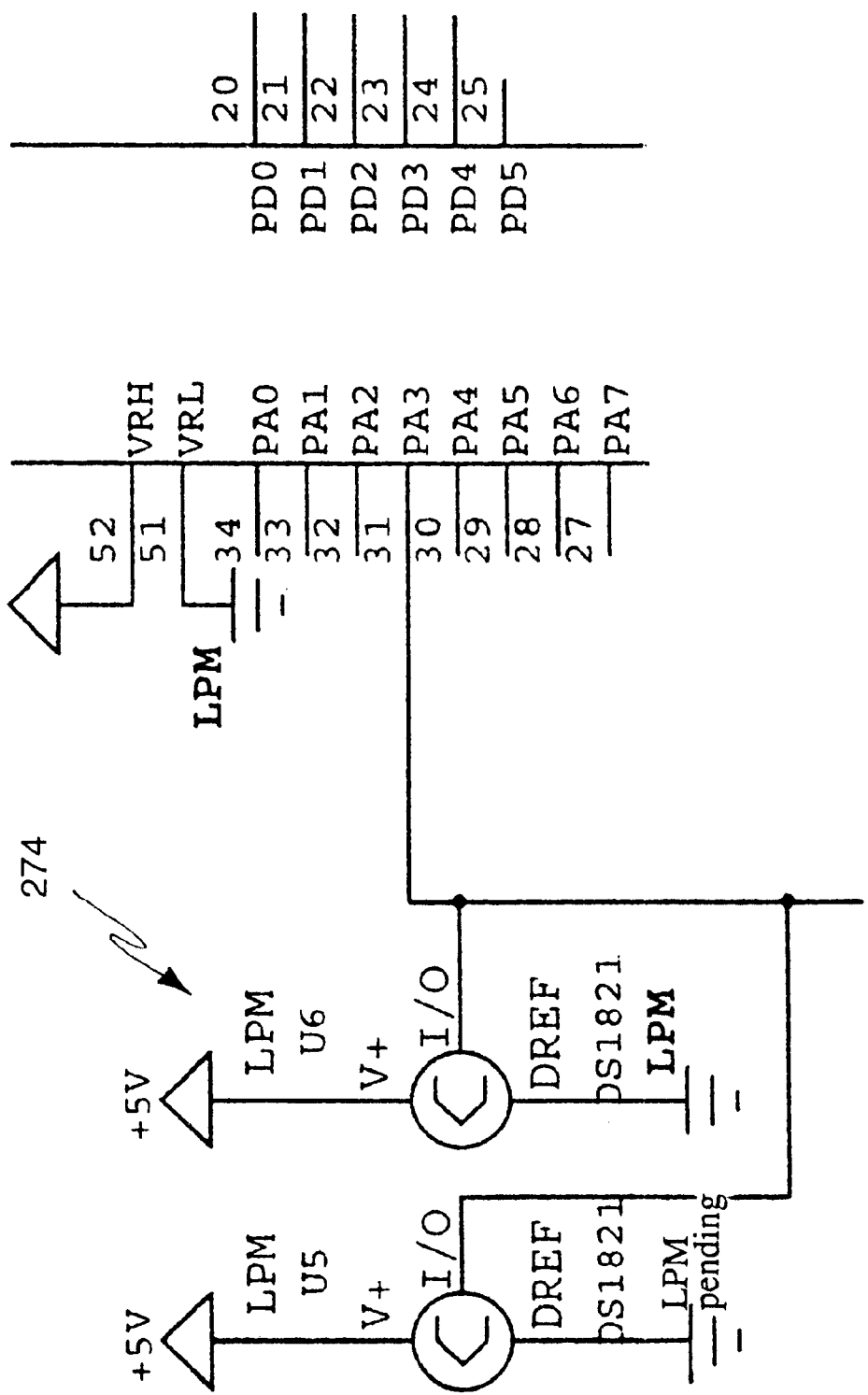
Figure 12D:
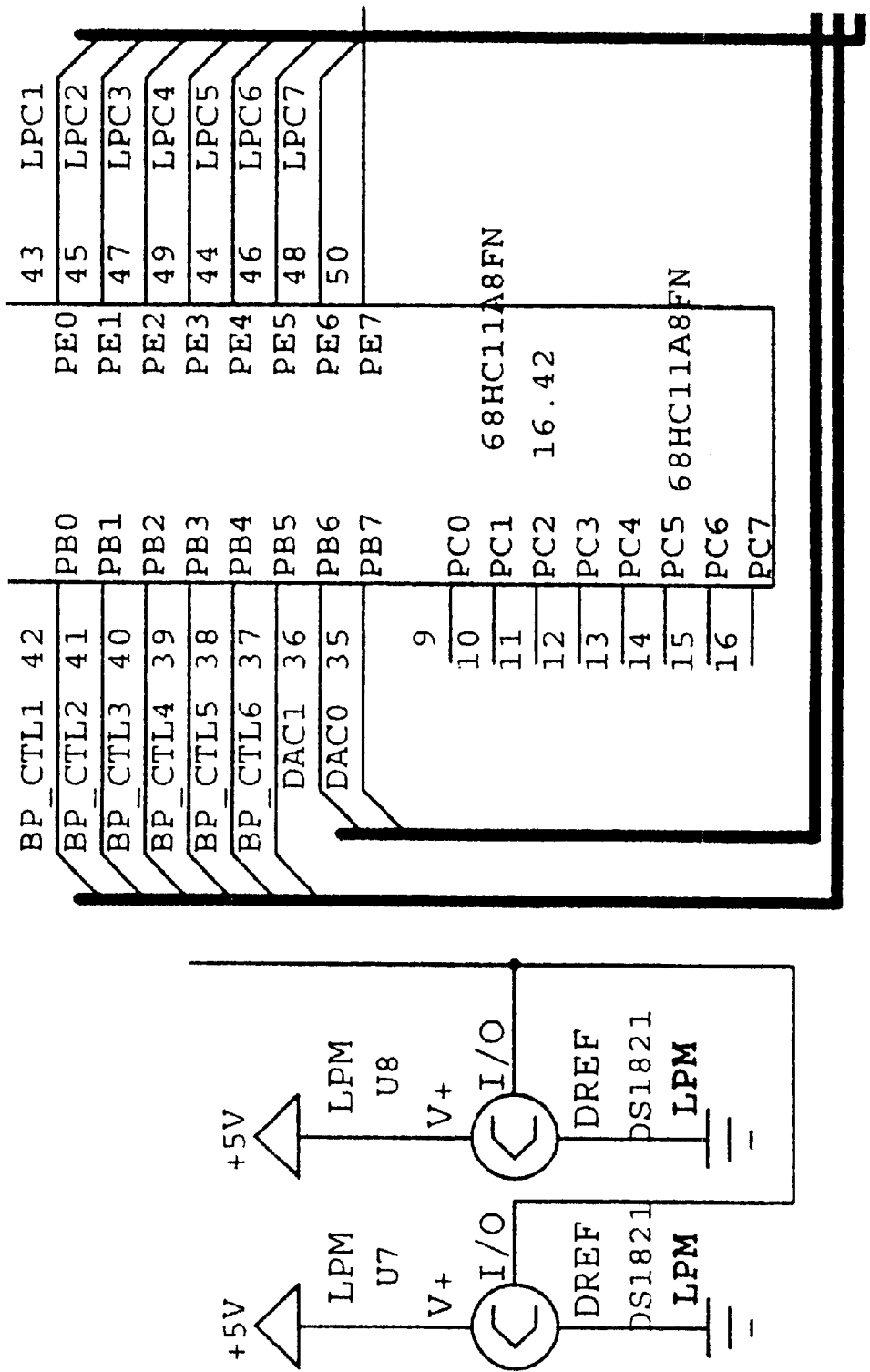
Figure 12E:
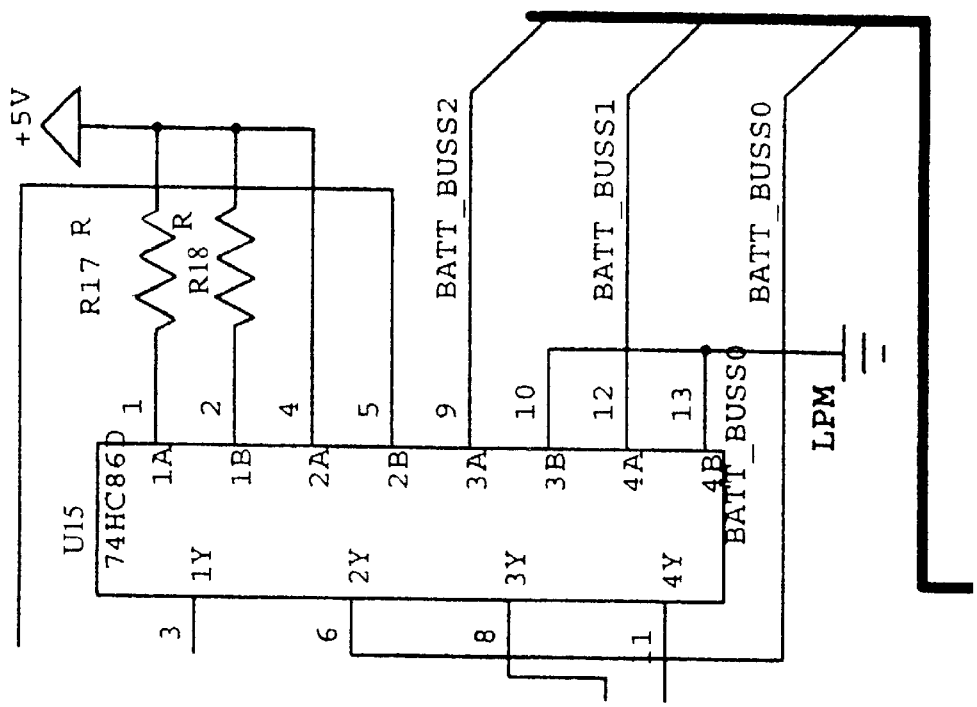
Figure 12F:
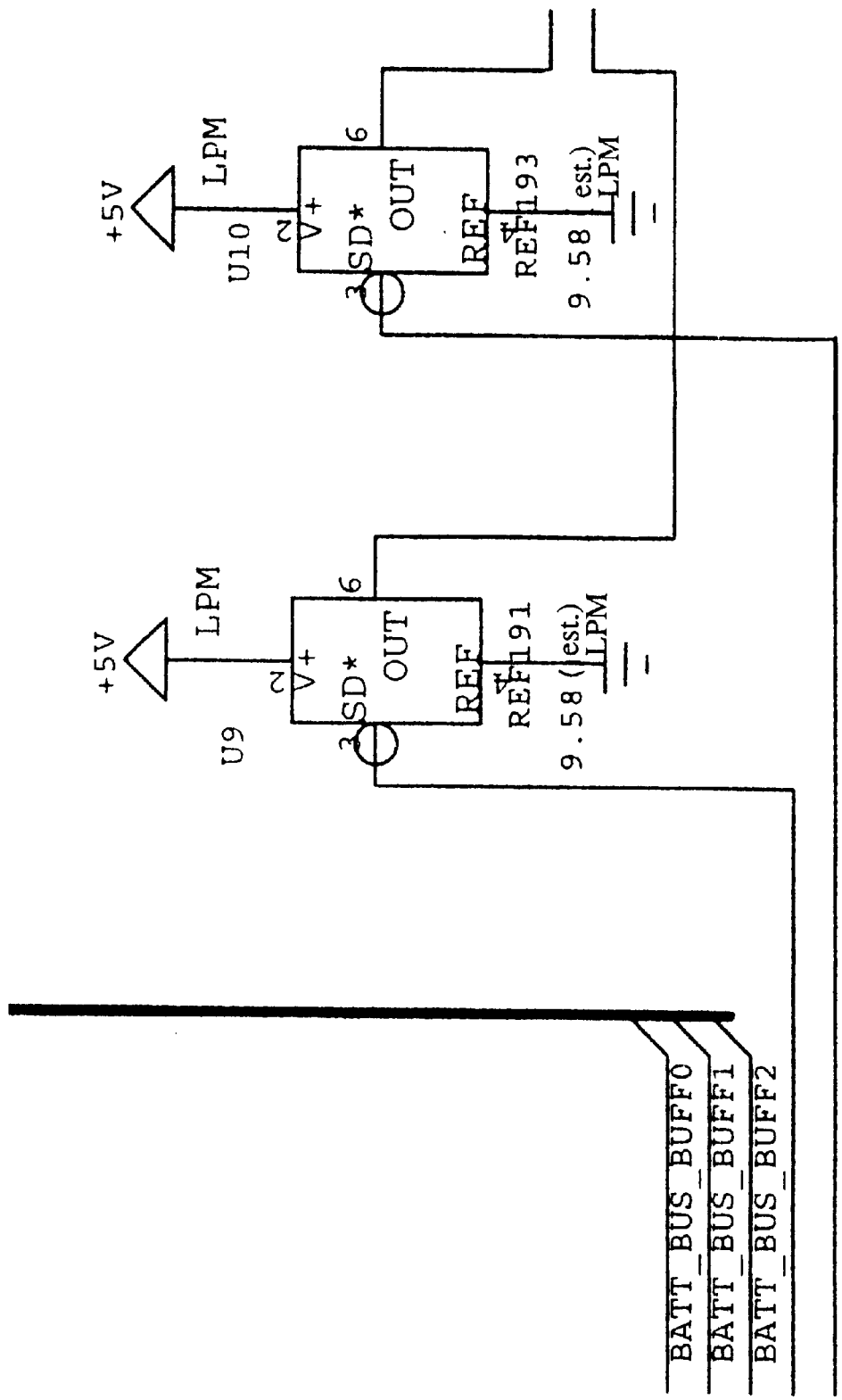
Figure 12G:
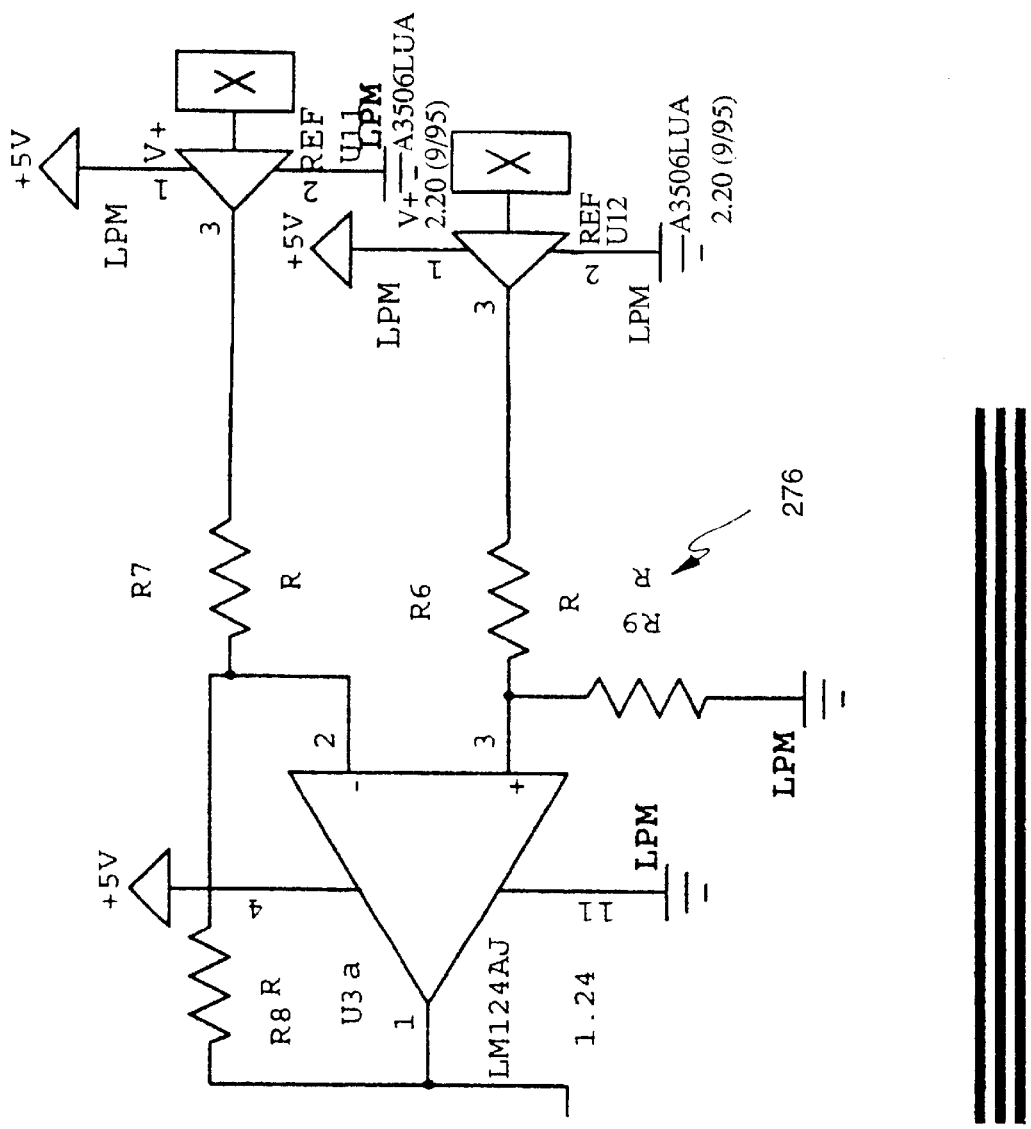
Figure 13A:
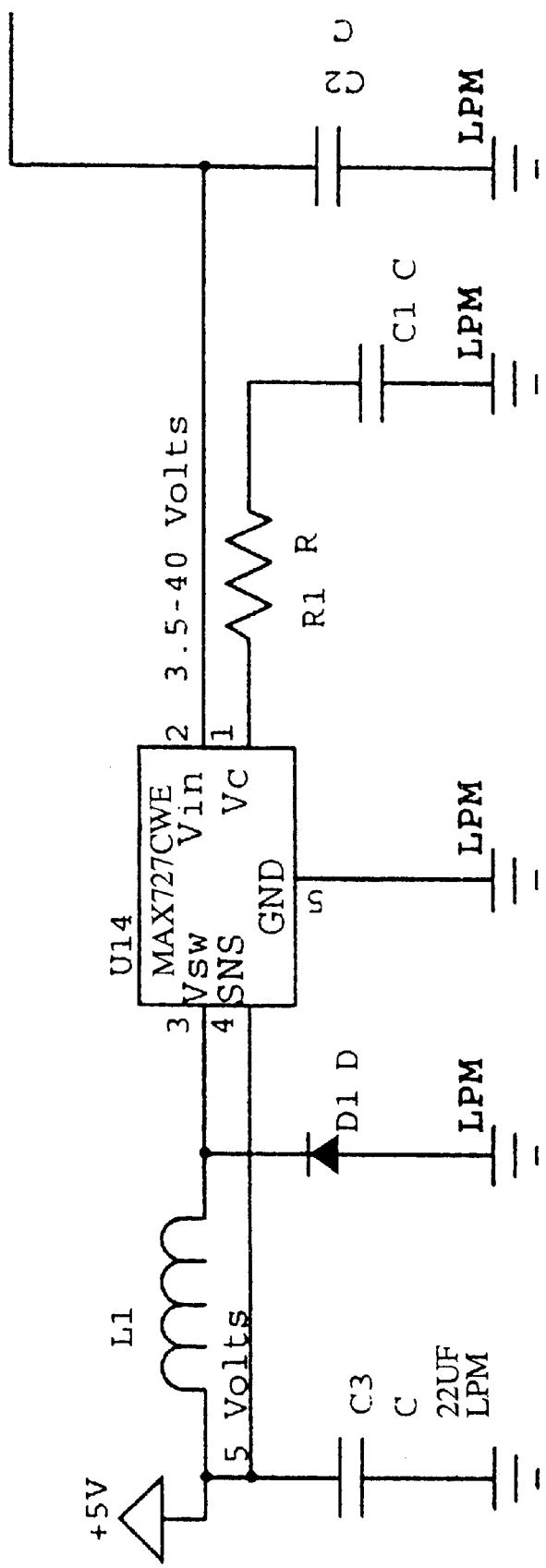
Figure 13B:
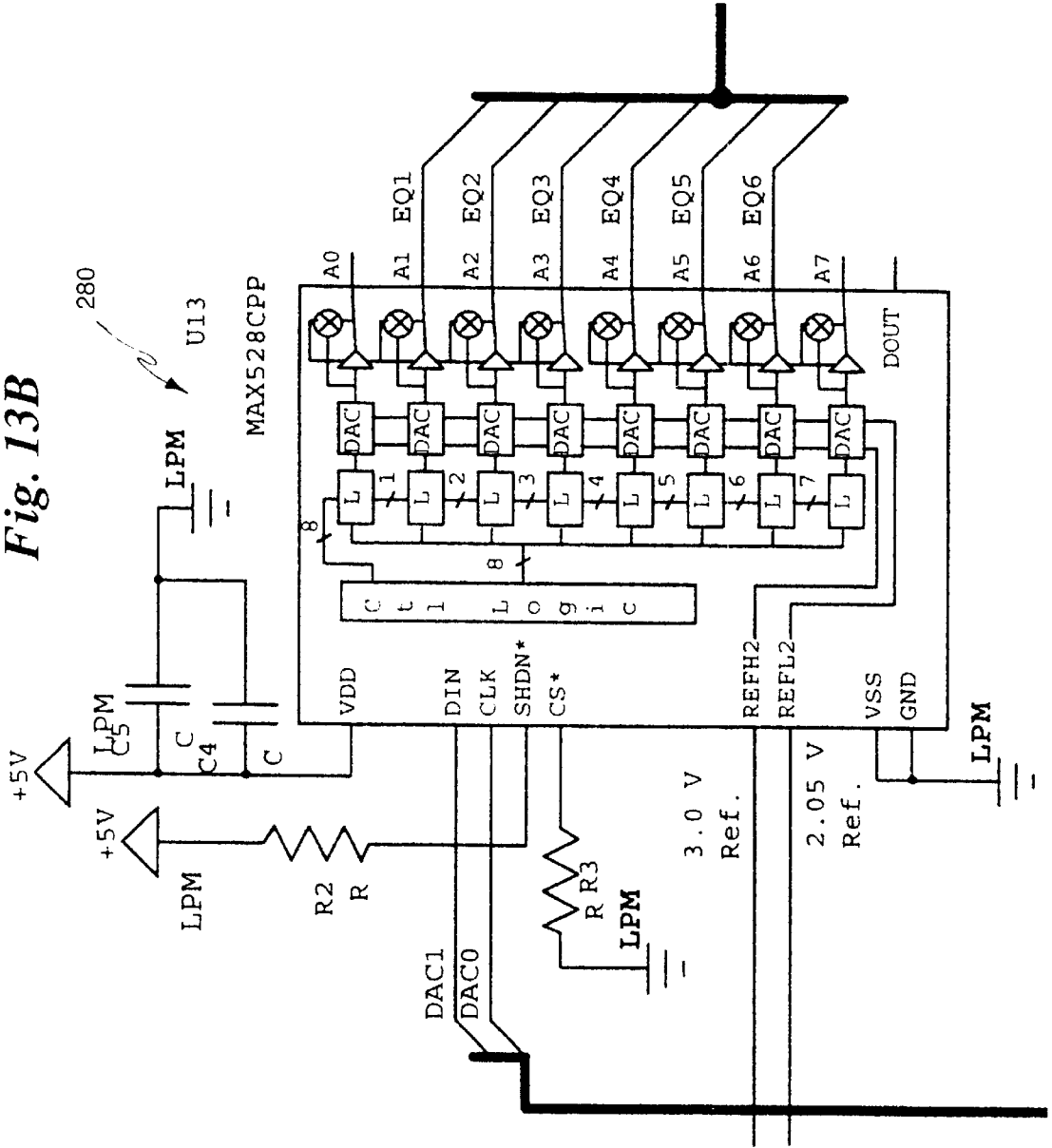
Figure 13C:
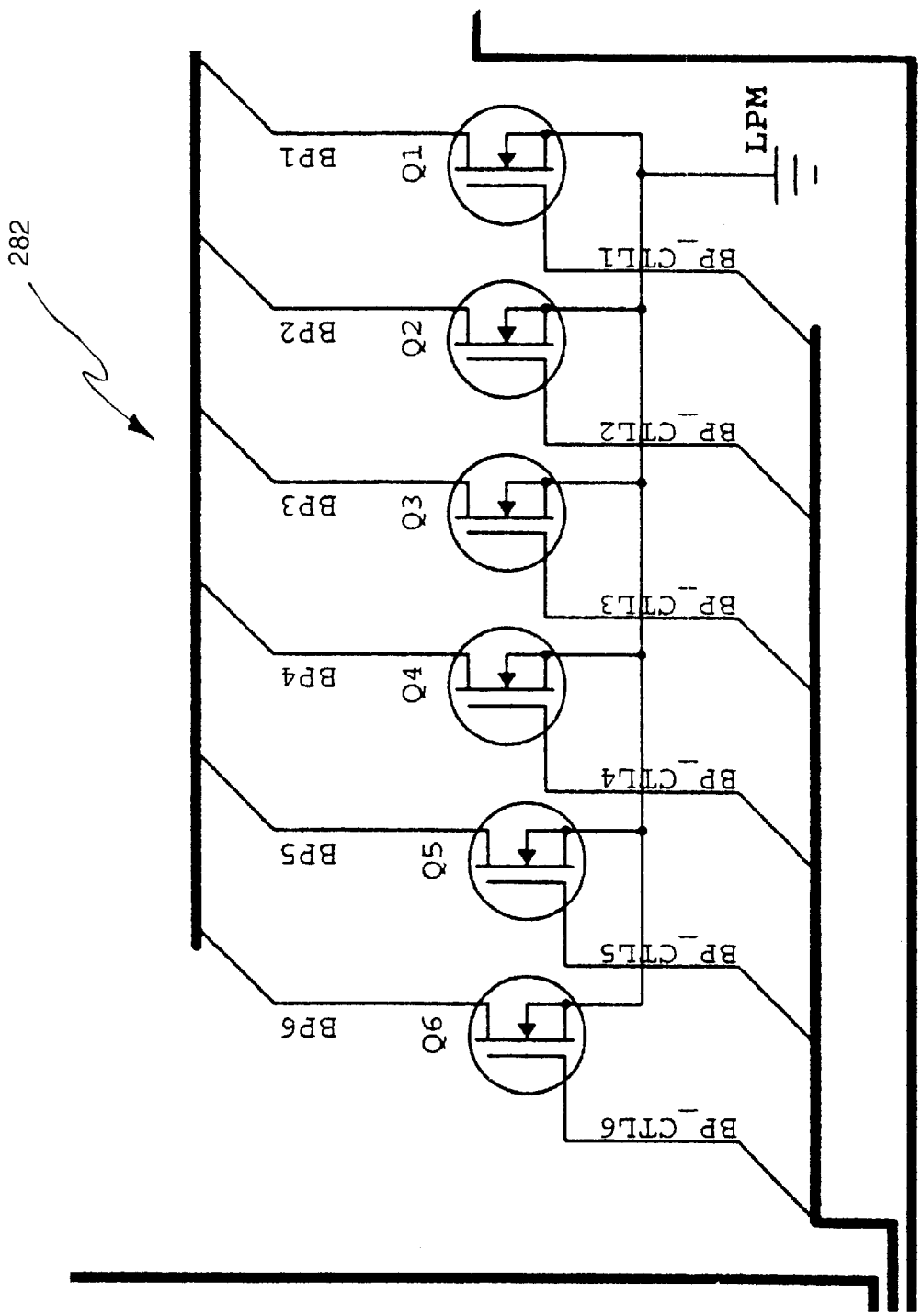
Figure 13D:
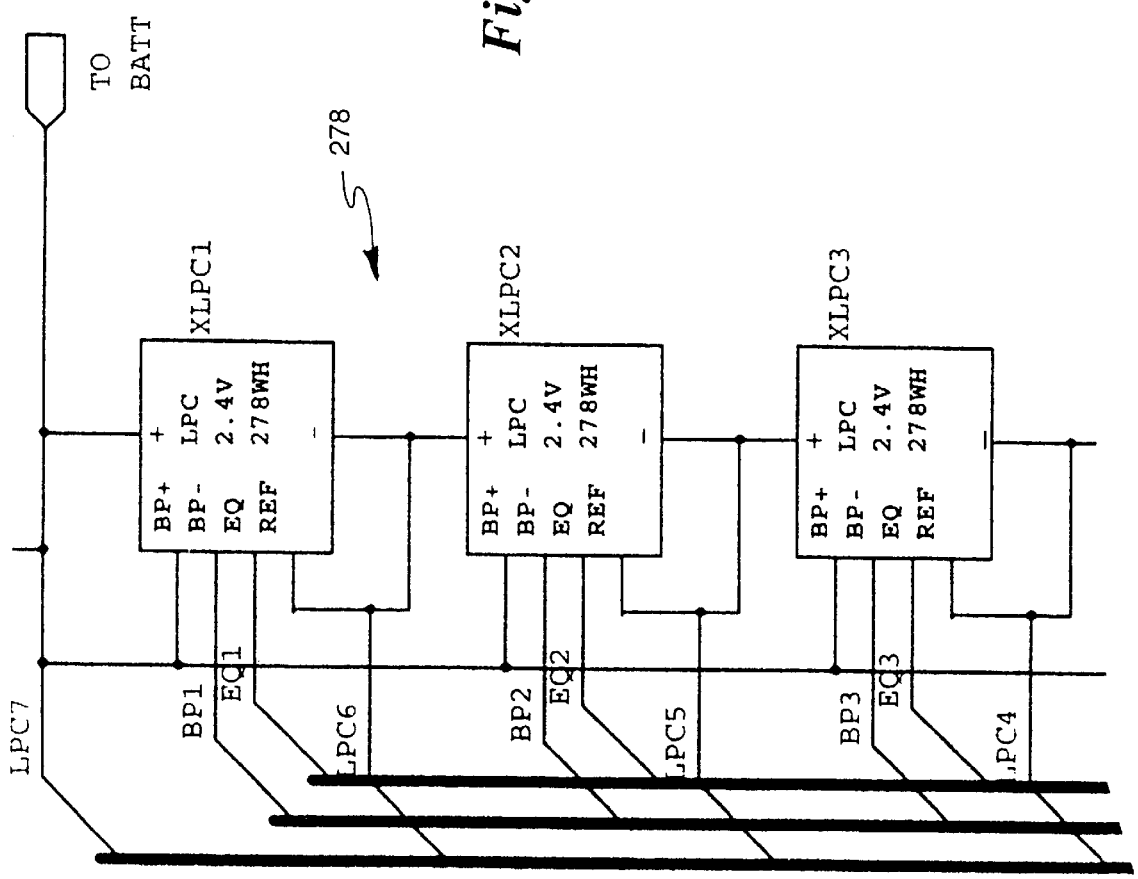
Figure 13E:
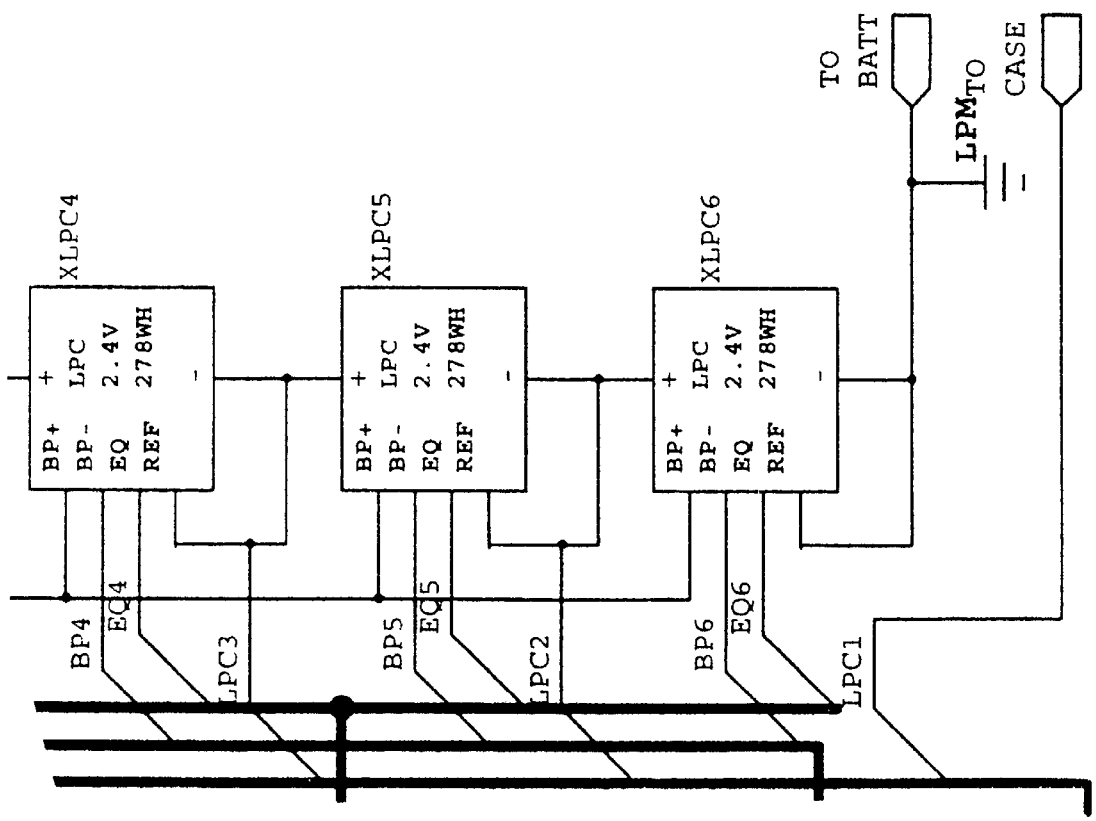

Turning now to FIGS. 12–13, there is illustrated in schematic form an embodiment of electronic circuitry which, in accordance with one embodiment, is provided in individual energy storing devices constituting a battery system. Each of the modules includes a micro-processor or micro-controller 270 which is coupled to the intra-battery network by use of a communications interface circuit 272. In one embodiment, the intra-battery network employs an RS-485 differential pair, and the communication interface circuit 272 includes an appropriate connector for coupling with the RS-485 differential pair. The battery computer may, for example, include a controller such as Model 68HC11 manufactured by Motorola or Model 8096 manufactured by Intel.

As is shown in FIG. 12, temperature sensing circuitry 274 is provided in each of the modules to determine the temperature at various locations within the module. The temperature sensors 274 produce signals which are transmitted to the module controller 270 which, in turn, compares the sensed temperature values with a pre-established threshold or range of nominal temperature values. The module temperature information which is acquired by the module controller memory is logged in the module controller 270 and reported to the battery computer. The data provided by the temperature sensing circuitry 274 disposed within each of the modules is used by the battery computer to regulate module and battery system temperatures, typically by controlling an external active cooling apparatus.

A current sensor 276 is employed to detect possible fault conditions through sensing of a differential current ($I_{Pos}-I_{Neg}$). Each module includes two current sensors which measure input and output current signals of the module. The input and output current signals are converted to a potential and applied to an operational amplifier circuit which computes a difference voltage indicative of the current differential ($I_{Pos}-I_{Neg}$). Two Hall effect sensors are employed to null out the effects of significant temperature dependencies.

The current sensing circuitry 276 shown in FIG. 12 may be employed to detect a number of inter-module fault conditions or operational anomalies. One particular inter-module fault condition which may be detected by use of the current sensing circuitry 276 concerns a breach in an insulating surface that may develop between the energy storage devices of the module and the electrically conductive case which houses the energy storage devices. The module control circuitry detects a change in module case potential or the development of a circulating current in the module case resulting from an insulation breach, and effects a corrective action to address the anomalous condition. The occurrence of such a fault condition and confirmation of remedying the fault condition are reported to the battery computer through the intra-battery network. In one embodiment, the module control circuitry implements the fault detection methodology disclosed in co-pending application Ser. No. 08/900,611 entitled "In-Situ Fault Detection Apparatus And Method For An Encased Energy Storing Device" (Hagen et al.), the contents of which are incorporated herein by reference.

The module control circuitry shown in FIG. 13 includes a digital-to-analog converter (DAC) 280 which permits the module controller 270 to interface with each of the cell packs 278 contained within the module. Through use of the DAC 280, for example, the module controller 270 transmits dynamic equalization setpoint parameters to each of the cell packs during a charging procedure. The module controller 270 communicates other setpoint and control parameters to individual cell packs 278 constituting the module during various phases of charging and discharging, such as a pre-balancing phase. In one embodiment, the module controller 270 implements the equalization and overvoltage protection methodology disclosed in co-pending application Ser. No. 08/900,607 entitled "Equalizer System and Method for Series Connected Energy Storage Devices" (Rouillard et al.), the contents of which are incorporated herein by reference.

Also shown in FIG. 13 is a bypass assertion circuit 282 which is controlled by the module controller 270 to effect a bypass of a defective cell pack within the module. The bypass operation may be effected solely by the module controller 270 when operating in a stand-alone mode or in response to a bypass control signal received from the battery computer. In one embodiment, the module controller 270 implements the bypass control methodology disclosed in application Ser. No. 08/900,325 entitled "Bypass Apparatus And Method For Series Connected Energy Storage Devices" (Rouillard et al.), now U.S. Pat. No. 5,952,815, the contents of which are incorporated herein by reference.

Figure 14:
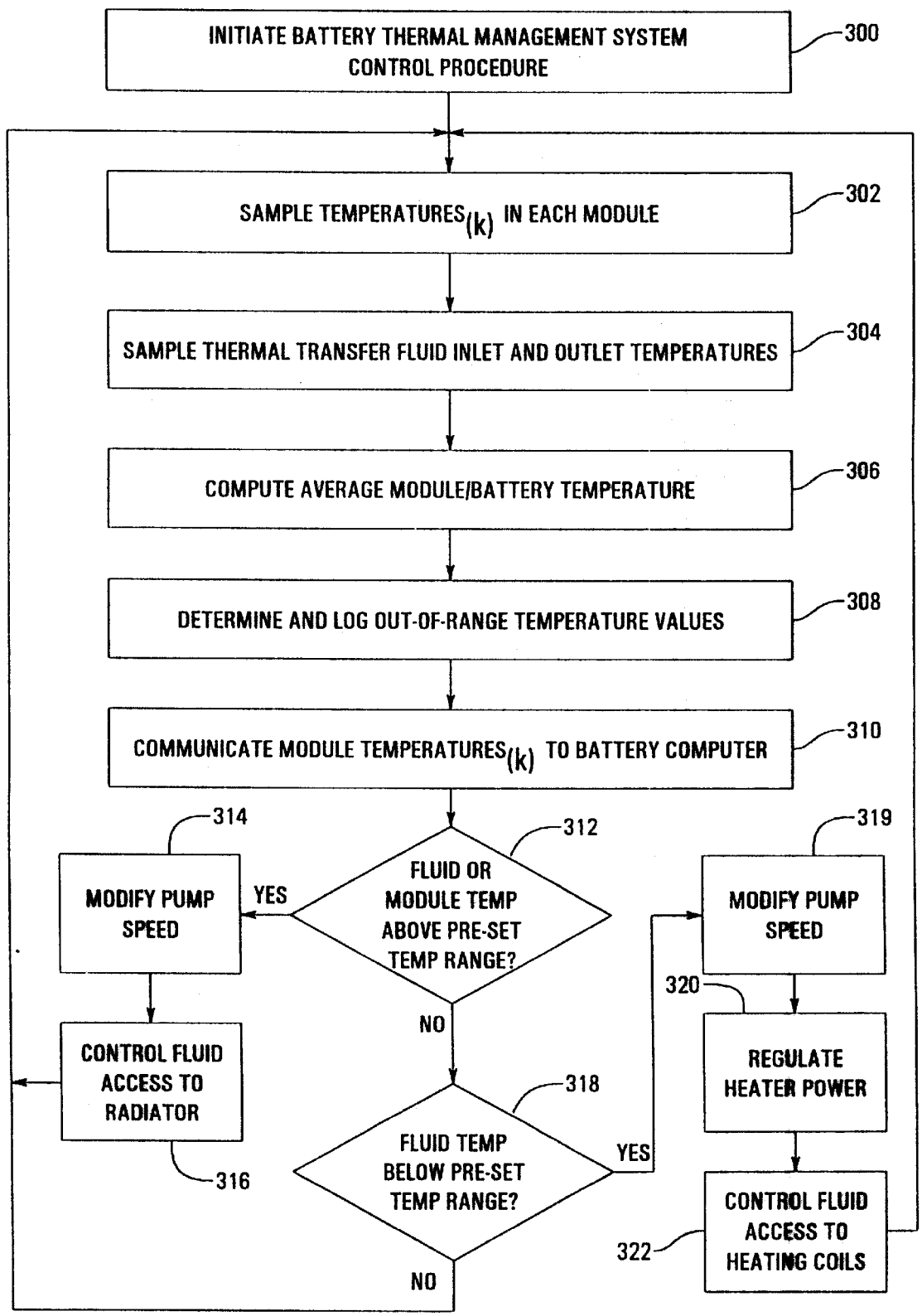
FIG. 14 is a flow chart illustrating various process steps coordinated by a battery computer involving the control of a thermal management system for a fault-tolerant distributed battery system.
Figure 15:
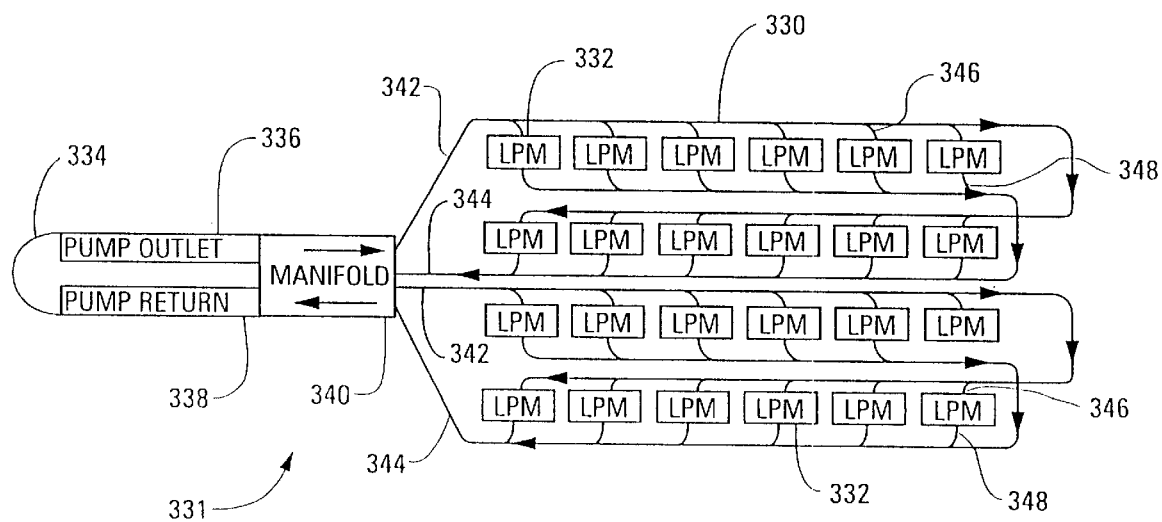
FIG. 15 is a depiction of an active thermal management system of a fault-tolerant distributed battery system.
Figure 16:
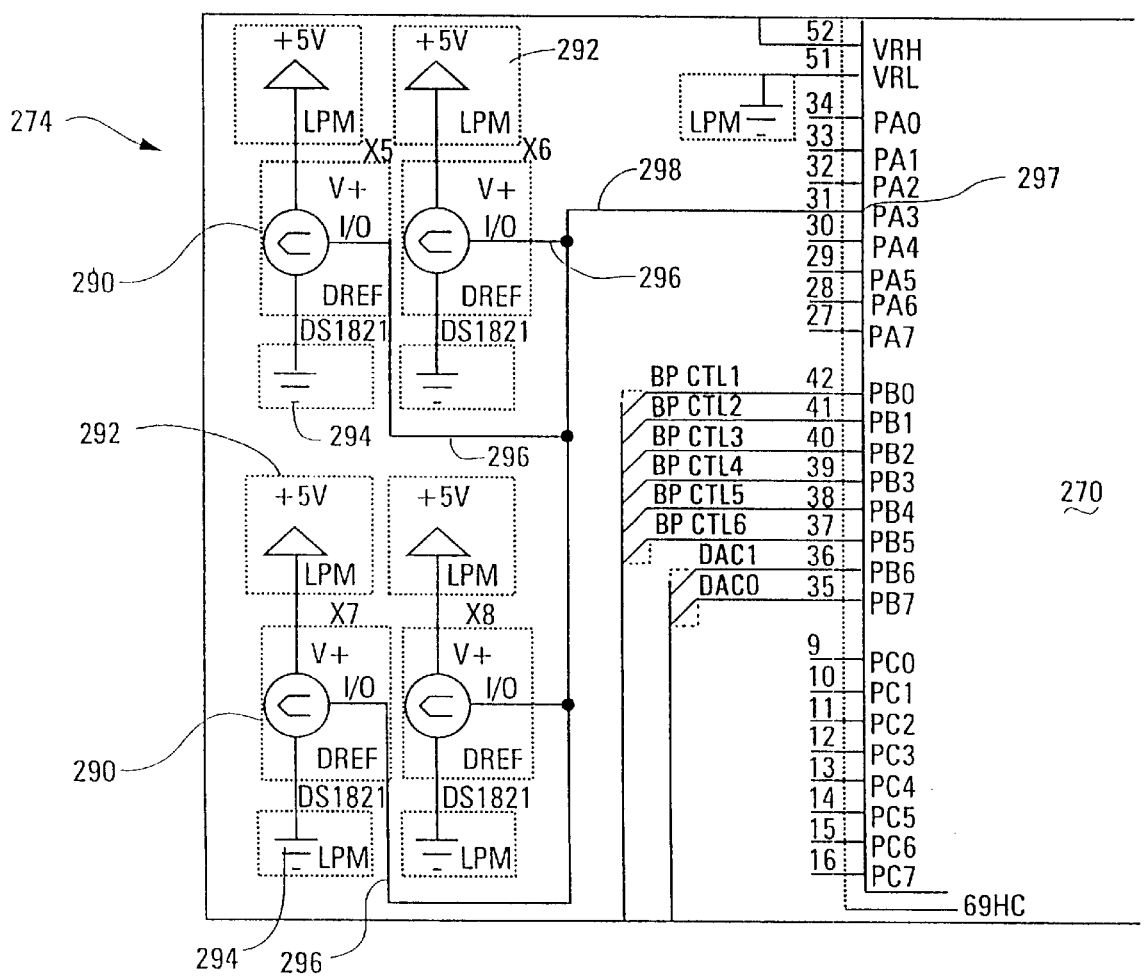
FIG. 16 illustrates in schematic form a number of sensors that provide temperature information for the modules and cooling/heating system of a fault-tolerant distributed battery system.

In FIG. 14, there is provided in flow diagram form various process steps involving the thermal management of a battery system such as that depicted in FIG. 15. Initiating 300 a thermal management control procedure for the distributed battery system 330 involves sampling 302 the temperature of individual modules 332 constituting the battery system 330. In one embodiment, and with reference to FIG. 16, each module 332 is provided with four temperature sensors 290 which are situated at various locations within the module 332. Each of the four temperature sensors 290 is coupled to a +5 V source and a common module ground 294. It is noted that a regulated +5 V source may be developed directly from the host module 332 or from an external voltage source. In the embodiment shown in FIG. 16, the signal output 296 of each temperature sensor 290 is connected to a common bus which, in turn, is coupled to an input port 297 of the controller 270.

Depending on the type of temperature sensor 290 selected, the signal output 296 of the temperature sensors 290 tied to the bus 298 may be connected directly to a digital input port 297 of the controller 270. Temperature sensors which may be employed in this configuration include Models DS1820 and DS1821 manufactured by Dallas Semiconductor. Other types of temperature sensors may be coupled to the digital input port 297 of the controller 270 using an analog-to-digital converter (ADC).

The battery computer, in cooperation with a number of temperature sensors, also samples 304 the temperature of a heat transfer fluid passing through an inlet port 344 and an outlet port 342 of an active cooling system 331 of the battery system 330. Individual and average module and battery temperatures are computed 306 by the module controller 270. The module controller 270 determines 308 whether the sensed temperature values have exceeded a setpoint temperature value or range of values, such as low and high setpoint temperature values. Out-of-range temperatures are logged 308 by the module controller 270 and communicated 310 to the battery computer.

In response to determining 312, 318 that the heat transfer fluid or a module temperature exceeds a low or high temperature, the battery computer regulates the flow rate and temperature of the heat transfer fluid to offset the detected temperature increase or decrease. For example, the battery computer modifies 314, 319 the speed of a pump 334 and controls 316, 320, 322 fluid access to a radiator or heater coils (not shown) to respectively cool and heat the fluid which, in turn, cools or heats the modules 332. The flow rate of heat transfer fluid into and out of particular modules 332 may be further regulated by use of controllable valves (not shown) provided at the input and/or output 346, 348 of individual modules 332. Pump outlet 336 and pump return 338 pressures and flow rates may be controlled through use of a manifold 340 situated between the pump 334 and the battery system fluid flow conduits 342, 344.

Figure 2B:
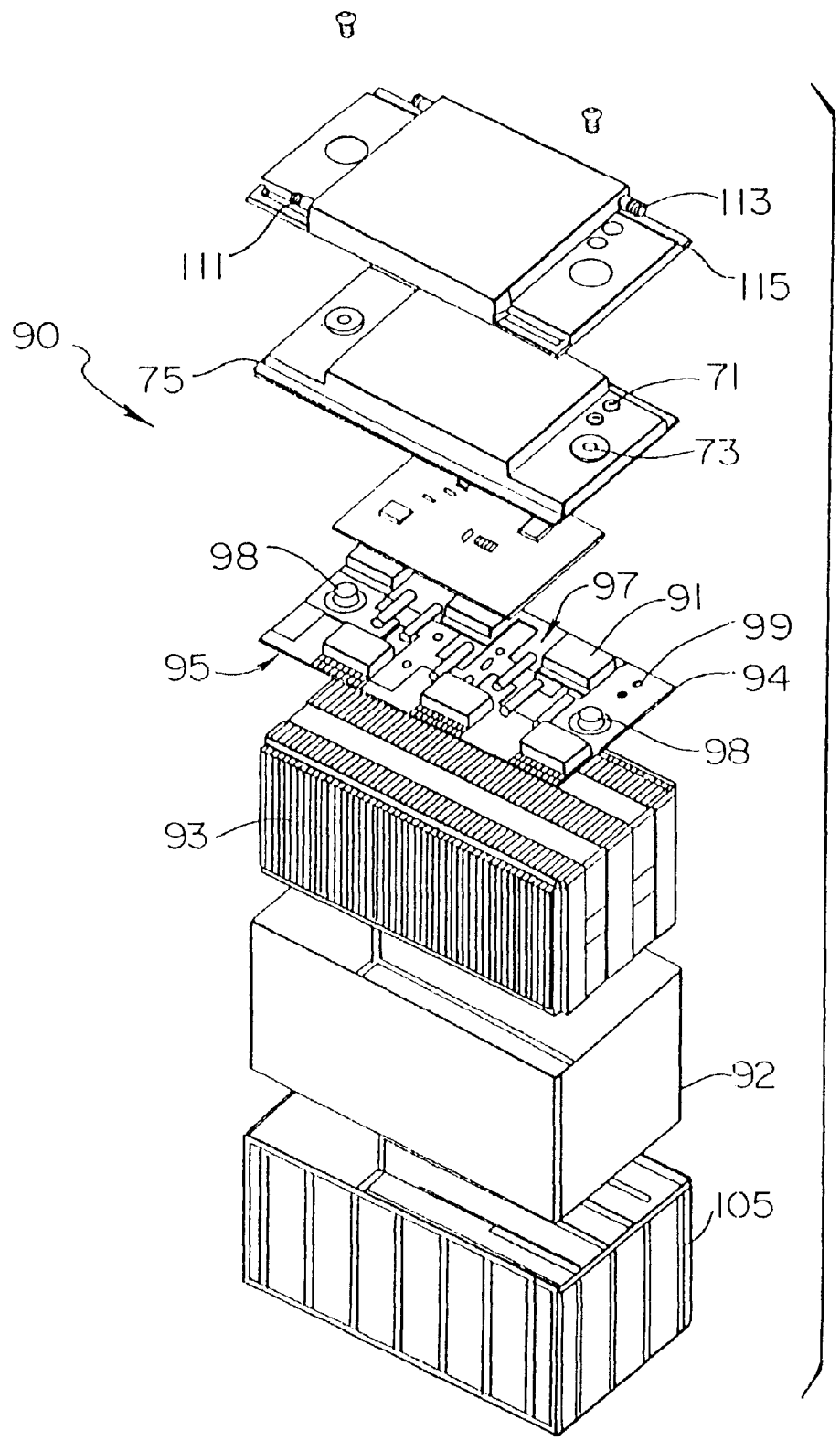
FIG. 2B illustrates an embodiment of a solid-state energy storing module which includes a stack of thin-film electrochemical cells selectively interconnected in a series and/or parallel relationship by use of an interconnect board, the cells and interconnect board being disposed in a hermetically sealed housing.
Figure 2C:
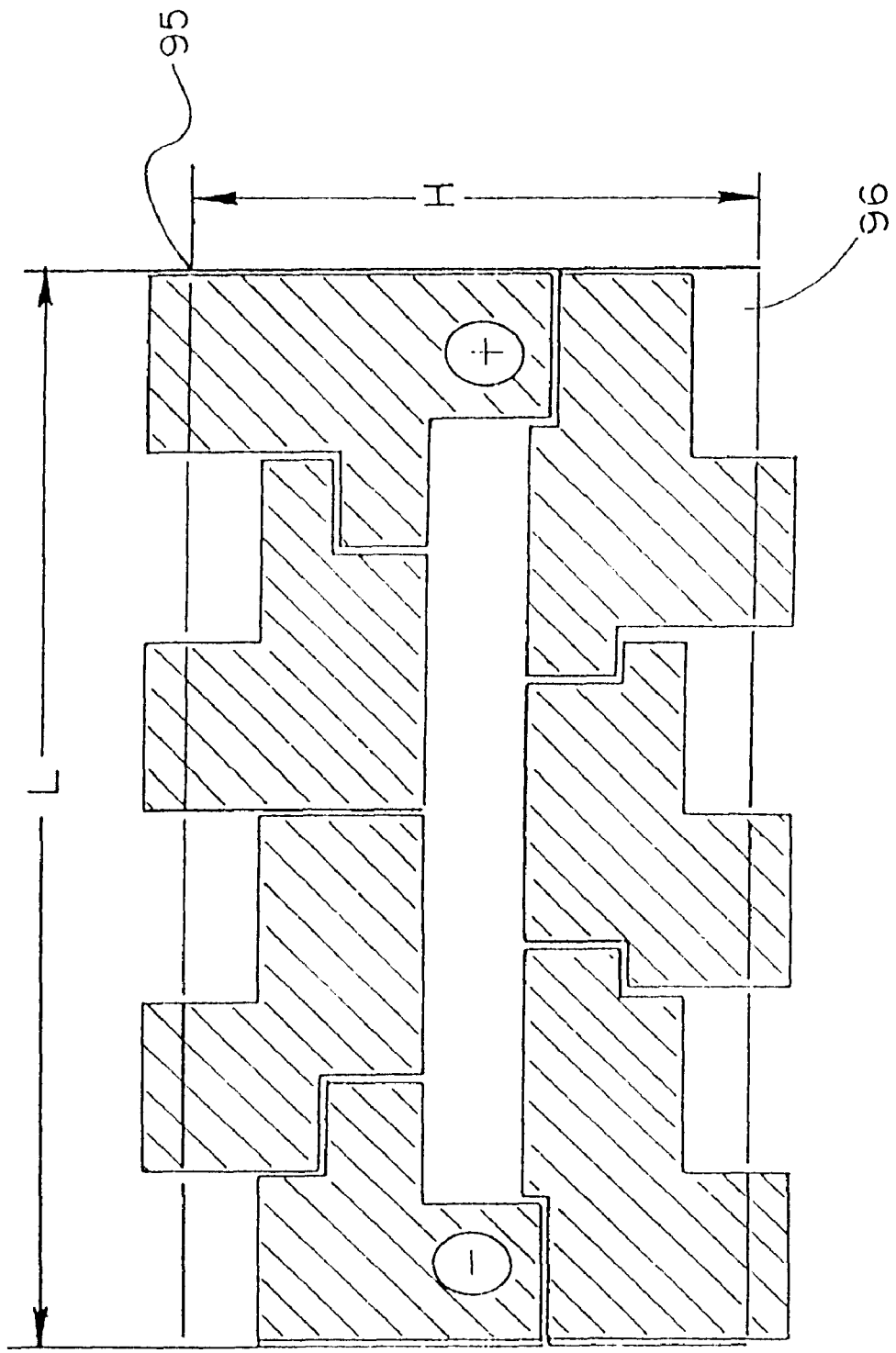
FIG. 2C illustrates a surface of an interconnect board having a connection pattern disposed thereon for providing selective series and/or parallel connectivity with a number of electrochemical cells.

In accordance with one embodiment of the present invention, and as illustrated in FIGS. 2B–2C, an energy storing module 90 includes an inner housing 92 within which a stack of electrochemical cells 93 and an integrated interconnect board 94 are disposed. The interconnect board 94 includes a connection pattern or conductivity grid 95 which, when the board 94 is installed within the housing 93, interconnects the electrochemical cells 93 in accordance with a pre-established connection configuration. The connection pattern or grid 95 is typically affixed or otherwise bonded to a sheet of insulating material 96, such as a substantially rigid plastic or laminate material.

A number of electrical and electromechanical components are typically mounted on the interconnect board 94. As is shown in FIG. 2B, for example, the interconnect board 94 includes a number of fuse packs 91, equalizer and bypass devices 97, and positive and negative power terminals 98. Communication connectors 99 are also disposed on the interconnect board 94 which couple to one or more external communication lines. It is understood that any or all of the components populating the interconnect board 94 may be mounted on boards or platforms other than the interconnect board 94, and situated internal to or externally of the module housing 92.

In one embodiment, the interconnect board 94 and the electrochemical cells 93 are disposed in a hermetically sealed housing 92, with the power and communication lines passing into the housing through hermetically sealed feed-throughs 71, 73 provided on an inner housing cover 75. The inner housing cover 75 is typically welded to the inner housing 92 to create a hermetic seal therebetween. Further, the sealed energy storing module 90 includes an internal thermal management system that provides for the transfer of heat between the cells 93 and the housing 92, and between the interconnect board 94 and the housing 92.

An external thermal management system may be employed which is situated external to the housing 92 to further facilitate the transferring of heat into and out of the module 90. A heat transfer medium may be introduced into the module through inlet and outlet ports 111, 113 provided on an outer shell cover 115 of the module 90. The heat transfer medium may be forced through cooling channels formed or provided between the housing 92 and an outer shell 105. The temperature and flow rate of the heat transfer medium may be adjusted as needed by the external thermal management system. An exemplary internal thermal management scheme for a sealed energy storing module is disclosed in co-pending application Ser. No. 08/900,566 entitled "Thermal Management System and Method for a Solid-State Energy Storing Device" (Rouillard et al.), the contents of which are incorporated herein by reference.

As is best shown in FIG. 2C, the interconnect board 94 typically includes a patterned conductive surface 95 which advantageously provides for the interconnecting of autonomous electrochemical cells 93 in accordance with a pre-designed connection layout. A significant advantage realized by employing an interconnect board 94 having a patterned interconnection surface 95 concerns the flexibility by which a desired current and voltage rating may be achieved irrespective of, and without disrupting, the position of individual electrochemical cells 93 relative to one another within the housing 92. An exemplary interconnect board which is well-suited for use in a solid-state energy storing module is disclosed in co-pending application Ser. No. 08/900,427 entitled "Solid-State Energy Storage Module Employing Integrated Interconnect Board" (Rouillard et al.), the contents of which are incorporated herein by reference.

It will, of course, be understood that modifications and additions can be made to the various embodiments discussed hereinabove without departing from the scope or spirit of the present invention. By way of example, the principles of the present invention may be employed for use with battery technologies other than those exploiting lithium polymer electrolytes, such as those employing nickel metal hydride (Ni—MH), lithium-ion, (Li—Ion), and other high-energy battery technologies. Accordingly, the scope of the present invention should not be limited by the particular embodiments discussed above, but should be defined only by the claims set forth below and equivalents thereof.

What we claim is:

1. A fault-tolerant distributed battery system, comprising:
   a plurality of energy storing modules coupled in series to define a battery, each of the modules comprising a respective plurality of energy storing units; and
   an intra-battery network, comprising
      a plurality of module processors, each of the plurality of module processors being coupled to one of the plurality of modules; and
      a main computer coupled to the module processors, the main computer communicating with the module processors to monitor and control the modules in a network mode of operation, and the module processors, in response to an absence of network connectivity with the main computer, monitoring and controlling their respective modules in a standalone mode of operation.

2. The system of claim 1, wherein a particular module processor operating in a standalone mode of operation communicates with the main computer via a communication line established between the particular module processor and a module processor operating in a network mode of operation.

3. The system of claim 1, wherein each of the module processors monitors a voltage state and a current state of a respective module, the voltage and current states of a particular module of the plurality of modules being transmitted to the main computer in response to a polling signal transmitted from the main computer and received by the particular module.

4. The system of claim 1, wherein each of the module processors monitors a voltage state and a current state of each of its associated energy storing units, the voltage and current states of the energy storing units of a particular module of the plurality of modules being transmitted to the main computer in response to a polling signal transmitted from the main computer and received by the particular module.

5. The system of claim 1, wherein the main computer constitutes either one of a main computer of the distributed battery system or a main computer separate from the distributed battery system.

6. The system of claim 1, wherein each of the module processors transmits module voltage information to the main computer, and the main computer computes charging parameters using the module voltage information, the charging parameters being transmitted from the main computer to the module processors prior to initiating a charging procedure.

7. The system of claim 1, wherein, upon detection of an anomalous voltage condition arising in a defective energy storing unit of a particular module, either the main computer, when operating in the network mode of operation, or the processor of the particular module, when operating in the standalone mode of operation, effects a bypass of the defective energy storing unit.

8. The system of claim 1, wherein the main computer polls each of the module processors during a charging procedure to acquire voltage and temperature information for each of the modules.

9. The system of claim 8, wherein the main computer modifies the charging procedure in response to the acquired voltage information.

10. The system of claim 1, wherein:
   the battery system further comprises a thermal management system for regulating a temperature of the modules; and
   the main computer controls the thermal management system to maintain the temperature of the modules within a nominal temperature range.

11. The system of claim 1, wherein module status information is logged by each of the module processors on a routine basis during a standalone or network mode of operation.

12. The system of claim 11, wherein the module status information logged by a particular module processor while operating in a standalone mode of operation is uploaded to the main computer after reestablishing network connectivity between the particular module processor and the main computer.

13. The system of claim 1, wherein the intra-battery network has a substantially star, bus, hybrid star, or hybrid bus configuration.

14. The system of claim 1, wherein each of the energy storing units comprises a thin-film, lithium polymer electrochemical cell.

15. A fault-tolerant distributed energy storing system, comprising:
 a plurality of separately housed energy storing modules each comprising a plurality of energy storing units, the energy storing modules being connected to a power line;
 a battery computer;
 a plurality of module processors, each of module processors being disposed in a housing of one of the energy storing modules and coupled to its respective energy storing units and the battery computer; and
 an input sensor and an output sensor coupled to the power line at a respective input and output of each of the energy storing modules, the input and output sensors detecting a parameter of power and each of the module processors detecting a fault condition arising in its respective energy storing module using the power parameter, each of the module processors effecting a corrective action upon detection of the fault condition when operating in a standalone mode of operation and the battery computer effecting the corrective action upon detection of the fault condition when operating in a network mode of operation.

16. The system of claim 15, wherein each of the module processors detects the fault condition using a difference in the power parameter detected by respective input and output sensors.

17. The system of claim 15, wherein the power parameter detected by the input and output sensors is either one of a current parameter or a voltage parameter.

18. The system of claim 15, wherein the fault condition constitutes a short developed in an energy storing unit of a particular energy storing module, the processor of the particular energy storing module, when operating in a standalone mode of operation, effecting a bypass corrective action so as to isolate the shorted energy storing unit from the power line, and the battery computer effecting the bypass corrective action when operating in a network mode of operation.

19. The system of claim 15, wherein each of the energy storing units comprises a thin-film, lithium polymer electrochemical cell.

20. The system of claim 15, wherein the module processors and the battery computer define an intra-battery network having one of a substantially star, bus, hybrid star, or hybrid bus configuration.

21. The system of claim 15, wherein each of the module processors transmits voltage information for each of the energy storing units to the main computer, and the main computer computes charging parameters using the voltage information, the charging parameters being transmitted from the main computer to the module processors prior to initiating a charging procedure.

22. A method of controlling a plurality of independent energy storing modules each comprising a module processor and a plurality of energy storing units, the module processors communicating with a main computer external to the energy storing modules, the method comprising:
 monitoring connectivity between the module processors and the main computer;
 detecting a power parameter of each of the energy storing units;
 effecting, in response to a loss of the connectivity between a particular module processor and the main computer, a corrective action by the particular module processor to address a fault condition associated with a defective energy storing unit; and
 effecting, in response to continued connectivity established between the particular module processor and the main computer, the corrective action by the main computer to address the fault condition associated with the defective energy storing unit.

23. The method of claim 22, wherein the main computer performs the detecting of the power parameter of each of the energy storing units.

24. The method of claim 22, wherein the respective module processors perform the detecting of the power parameter of each of the energy storing units.

25. The method of claim 24, wherein detecting of the power parameter of each of the energy storing units by the respective module processors further comprises:
 logging the power parameter during periods of connectivity loss between a particular module processor and the main computer; and
 uploading the power parameter from the particular module processor to the main computer after reestablishing connectivity between the particular module processor and the main computer.

26. The method of claim 22, wherein detecting the power parameter of each of the energy storing units associated with each of the energy storing modules further comprises:
 transmitting the power parameter of each of the energy storing units to the main computer;
 computing charging parameters using the power parameters; and
 transmitting the charging parameters from the main computer to the module processors prior to initiating a charging procedure.

27. The method of claim 22, wherein:
 monitoring the power parameter of each of the energy storing units comprises monitoring a voltage of each of the energy storing units; and
 effecting the corrective action comprises effecting a bypass of a particular energy storing unit upon detection of an anomalous voltage condition arising in the particular energy storing unit.

* * * * *

UNITED STATES PATENT AND TRADEMARK OFFICE
CERTIFICATE OF CORRECTION

PATENT NO. : 6,104,967
DATED : August 15, 2000
INVENTOR(S) : Ronald A. Hagen et al.

It is certified that error appears in the above-identified patent and that said Letters Patent is hereby corrected as shown below:

<u>Title page,</u>
Item [73], after "3M Innovative Properties Company, St. Paul, MN" insert -- Hydro-Quebec, Montreal, Quebec --.

Signed and Sealed this

Twenty-third Day of April, 2002

Attest:

Attesting Officer

JAMES E. ROGAN
*Director of the United States Patent and Trademark Office*